United States Patent
Kihira et al.

(10) Patent No.: US 10,074,857 B2
(45) Date of Patent: Sep. 11, 2018

(54) TITANIUM OR TITANIUM ALLOY MATERIAL FOR FUEL CELL SEPARATOR HAVING HIGH CONTACT CONDUCTIVITY WITH CARBON AND HIGH DURABILITY, FUEL CELL SEPARATOR INCLUDING THE SAME, AND MANUFACTURING METHOD THEREFOR

(71) Applicant: NIPPON STEEL & SUMITOMO METAL CORPORATION, Tokyo (JP)

(72) Inventors: Hiroshi Kihira, Tokyo (JP); Yuuichi Yosida, Tokyo (JP); Taku Kagawa, Tokyo (JP); Takumi Nishimoto, Tokyo (JP); Koki Tanaka, Tokyo (JP); Masao Kimura, Tokyo (JP); Kiyonori Tokuno, Tokyo (JP); Kazuhiro Takahashi, Tokyo (JP); Takashi Domoto, Tokyo (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 0 days.

(21) Appl. No.: 14/415,964

(22) PCT Filed: Jul. 30, 2013

(86) PCT No.: PCT/JP2013/070550
§ 371 (c)(1),
(2) Date: Jan. 20, 2015

(87) PCT Pub. No.: WO2014/021298
PCT Pub. Date: Feb. 6, 2014

(65) Prior Publication Data
US 2015/0147678 A1    May 28, 2015

(30) Foreign Application Priority Data

Jul. 31, 2012  (JP) ................................ 2012-170363

(51) Int. Cl.
*H01M 8/02* (2016.01)
*H01M 8/0228* (2016.01)
(Continued)

(52) U.S. Cl.
CPC .......... *H01M 8/0228* (2013.01); *C23C 14/34* (2013.01); *C23C 22/24* (2013.01); *C23C 22/54* (2013.01);
(Continued)

(58) Field of Classification Search
None
See application file for complete search history.

(56) References Cited

U.S. PATENT DOCUMENTS

2002/0160248 A1* 10/2002 Takao .................. C22C 38/004
429/492
2003/0068523 A1* 4/2003 Kaneta ................. B32B 15/018
428/670

(Continued)

FOREIGN PATENT DOCUMENTS

CA    2769855 A1 *  2/2011 .......... H01M 8/0206
CN    102171874 A    8/2011
(Continued)

OTHER PUBLICATIONS

International Search Report, dated Nov. 5, 2013, issued in PCT/JP2013/070550.
(Continued)

*Primary Examiner* — Miriam Stagg
*Assistant Examiner* — Victoria Hom Lynch
(74) *Attorney, Agent, or Firm* — Birch, Stewart, Kolasch & Birch, LLP

(57) ABSTRACT

A titanium or titanium alloy material for a separator of a polymer electrolyte fuel cell having high contact conductivity with carbon and high durability, and including an
(Continued)

Figure 1:
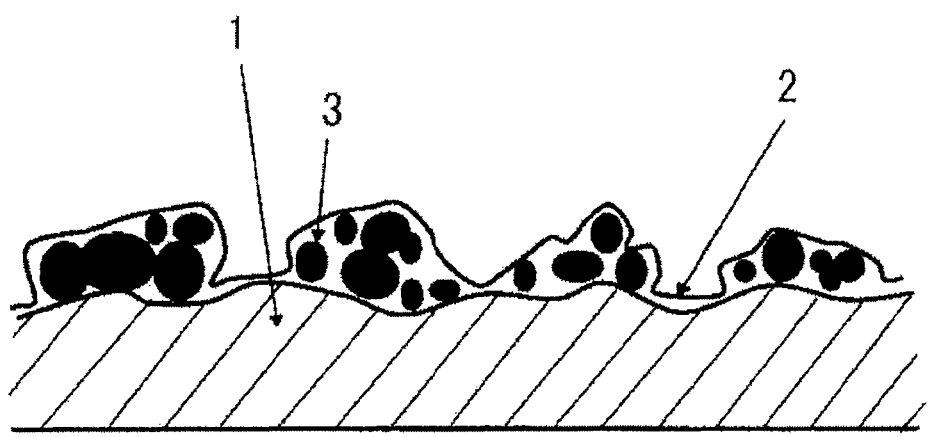

oxide film formed on a titanium or titanium alloy substrate by a stabilization treatment performed after a passivation treatment, and one or more kinds of conductive materials selected from carbide, nitride, carbonitride, and boride of tantalum, titanium, vanadium, zirconium, and chromium, the conductive materials being dispersed in the oxide film and having a major axis diameter of from 1 nm to 100 nm. A contact resistance value with a carbon paper is 20 mΩ·cm$^2$ or less at a surface pressure of 10 kgf/cm$^2$ before and after an accelerated deterioration test in which the titanium or titanium alloy material is immersed in a sulfuric acid aqueous solution having an adjusted pH of 4 at 80° C. for four days.

15 Claims, 2 Drawing Sheets

(51) Int. Cl.
  *C25D 11/26* (2006.01)
  *C23C 22/24* (2006.01)
  *C23C 22/54* (2006.01)
  *C23C 28/00* (2006.01)
  *H01M 8/0206* (2016.01)
  *H01M 8/0208* (2016.01)
  *C23C 14/34* (2006.01)
  *C23C 28/04* (2006.01)
  *C25D 11/10* (2006.01)

(52) U.S. Cl.
  CPC .......... *C23C 28/042* (2013.01); *C23C 28/322* (2013.01); *C23C 28/324* (2013.01); *C23C 28/3455* (2013.01); *C25D 11/10* (2013.01); *C25D 11/26* (2013.01); *H01M 8/0206* (2013.01); *H01M 8/0208* (2013.01); *Y02P 70/56* (2015.11)

(56) References Cited

U.S. PATENT DOCUMENTS

| | | | |
|---|---|---|---|
| 2008/0241411 A1* | 10/2008 | Ishikawa | A61L 27/06 427/444 |
| 2009/0181283 A1 | 7/2009 | Sato et al. | |
| 2009/0197143 A1* | 8/2009 | Kaneko | H01M 8/0206 429/483 |
| 2009/0226787 A1 | 9/2009 | Tanaka et al. | |
| 2011/0177430 A1* | 7/2011 | Takahashi | C23C 8/42 429/514 |
| 2012/0088185 A1 | 4/2012 | Maeda et al. | |
| 2012/0171468 A1 | 7/2012 | Tanaka et al. | |
| 2013/0130153 A1 | 5/2013 | Suzuki et al. | |
| 2013/0164654 A1 | 6/2013 | Suzuki et al. | |

FOREIGN PATENT DOCUMENTS

| | | |
|---|---|---|
| CN | 102473935 A | 5/2012 |
| EP | 2 031 687 A1 | 3/2009 |
| EP | 2 475 035 A1 | 7/2012 |
| JP | 11-162479 A | 6/1999 |
| JP | 2000-328200 A | 11/2000 |
| JP | 2004-273370 A | 9/2004 |
| JP | 2006-140095 A | 6/2006 |
| JP | 2007-5084 A | 1/2007 |
| JP | 2007-131947 A | 5/2007 |
| JP | 2007-234244 A | 9/2007 |
| JP | 2008-237425 A | 10/2008 |
| JP | 2009-170116 A | 7/2009 |
| JP | 2010-97840 A | 4/2010 |
| JP | 2010-129458 A | 6/2010 |
| JP | 2010-248570 A | 11/2010 |
| JP | 2010-248572 A | 11/2010 |
| JP | 2011-77018 A | 4/2011 |
| JP | 2012-28045 A | 2/2012 |
| JP | 2012-28046 A | 2/2012 |
| JP | 2012-28047 A | 2/2012 |
| JP | 2012-43775 A | 3/2012 |
| KR | 2002-0068964 | 8/2002 |
| KR | 2011-0036102 | 4/2011 |
| WO | WO 2007/145377 A1 | 12/2007 |
| WO | WO 2010/038544 A1 | 4/2010 |
| WO | WO 2011/016465 A1 | 2/2011 |

OTHER PUBLICATIONS

Written Opinion of the International Searching Authority, dated Nov. 5, 2013, issued in PCT/JP2013/070550.
Canadian Office. Action, dated May 27, 2016, for Canadian Application No. 2,876,276.
Chinese Office Action and Search Report, dated Apr. 18, 2016, for Chinese Application No. 201380040881.3, together with a partial English translation thereof.
Extended European Search Report dated Mar. 2, 2016 issued in corresponding European Patent Application No. 13826045.0.
Korean Office Action, dated Sep. 23, 2016, for corresponding Korean Patent Application (partial translation).

* cited by examiner

TITANIUM OR TITANIUM ALLOY MATERIAL FOR FUEL CELL SEPARATOR HAVING HIGH CONTACT CONDUCTIVITY WITH CARBON AND HIGH DURABILITY, FUEL CELL SEPARATOR INCLUDING THE SAME, AND MANUFACTURING METHOD THEREFOR

TECHNICAL FIELD

The present invention relates to a pure titanium substrate for industrial use or a titanium alloy substrate that is used for a separator of a polymer electrolyte fuel cell with low contact resistance, the polymer electrolyte fuel cell being used for automobiles that operate by using electric power as direct driving power, power generation systems, and the like. The present invention provides a titanium or titanium alloy material for a fuel cell separator having high contact conductivity with carbon and high durability, a fuel cell separator including the same, and a manufacturing method therefor.

BACKGROUND ART

In recent years, as fuel cells for automobiles, polymer electrolyte fuel cells have started to progress rapidly. The polymer electrolyte fuel cell is a fuel cell that uses hydrogen and oxygen, and also uses an organic film (composites with inorganic materials are also being developed) of a hydrogen-ion-selective-transmission type as electrolyte. Examples of hydrogen used as a fuel include pure hydrogen and a hydrogen gas obtained by modifying alcohols.

However, current fuel cell systems use components and members having high unit costs, and the cost for components and members needs to be lowered largely for consumer use. Further, for use in automobiles, the current fuel cell systems need not only to lower the cost, but also to downsize a stack, which serves as the center of the fuel cell. A polymer electrolyte fuel cell has a structure in which a membrane electrode assembly (hereinafter also referred to as MEA) including a solid polymer film, electrodes, and a gas diffusion layer, is sandwiched between separators, and a large number of MEAs are laminated to form a stack.

Examples of characteristics required for the separator include electron conductivity, a property of isolating an oxygen gas and a hydrogen gas at the respective electrodes, low contact resistance with the MEA, favorable durability in the environment inside a fuel cell, and the like. Here, the gas diffusion layer (GDL) in the MEA is generally formed with a carbon paper consisting of integrated carbon fibers, and accordingly, the separator is required to have favorable contact conductivity with carbon. Since a stainless steel or a titanium material used as materials for a separator generally has low contact conductivity with carbon without any treatment, many techniques have been proposed to increase the contact conductivity with carbon. A passivation film having low conductivity can serve as an obstacle to higher contact conductivity with carbon. Although this problem could be solved at the expense of the durability, extremely high durability is still required for a separator in the environment inside the fuel cell, which is a highly corrosive environment. For this reason, currently, it is quite difficult to develop a satisfactory metal material. Carbon separators have been the mainstream so far; however, if meal separators become available, the fuel cell itself can be downsized, and further, a break does not occur in the manufacturing process of the fuel cell. Accordingly, metal separators are said to be necessary to enable mass production and diffusion.

Under such circumstances, for example, Patent Document 1 discloses a technique that makes it possible to lower contact resistance of a stainless steel effectively, in terms of thinning, reducing weight, and the like, by use of a special stainless steel obtained by precipitating a conductive compound in a steel material. Highly durable titanium is also being studied to be used for a separator. In the same manner as a stainless steel, titanium has high contact resistance with the MEA by the presence of a passivation film on the outermost surface of titanium, and accordingly, for example, Patent Document 2 discloses an invention that enables a TiB-based precipitate to be diffused in titanium and the contact resistance with the MEA to be lowered. Patent Document 3 discloses a titanium alloy for a separator. The titanium alloy contains, by mass %, 0.5 to 15% Ta and a limited amount of Fe and O as necessary. Further, in the titanium alloy, a range from the outermost surface to 0.5 μm in depth has an average nitrogen concentration of 6 atomic % or more, and contains tantalum nitride and titanium nitride. It is also disclosed that, in a manufacturing method therefor, it is preferable to heat the titanium alloy at temperatures of 600 to 1000° C. for three seconds or more under a nitrogen atmosphere. Patent Documents 4, 5, and 6 disclose a technique to thrust a conductive material into the superficial layer by a blasting method or a roll processing method in a manufacturing process of a titanium or stainless steel metal separator. In this case, a surface microstructure in which the conductive material is disposed to penetrate a passivation film formed on the metal surface secures both contact conductivity with carbon and durability.

Patent Document 7 discloses a manufacturing method for a fuel cell separator, including converting impurities including titanium carbide or titanium nitride formed on the surface of titanium into oxide by anode oxidizing treatment, and then performing plating treatment. It is known that titanium carbide or titanium nitride formed on the surface of titanium is dissolved while being exposed to a corrosive environment during use and is re-precipitated as oxide to lower the contact conductivity. This method can be said to suppress oxidation of these impurities during generation of electricity (during use) and to increase durability. However, to secure conductivity and durability, an expensive plated film is necessary. Patent Document 8 discloses a technique to form an oxide film as a corrosion-resistant film by coating the surface of a titanium-based alloy with BN powder and by performing heat treatment thereon, the titanium-based alloy being used as a base material and being obtained by alloying Group 3 elements in the periodic table. This is a technique to increase conductivity by doping, with impurity atoms, a position of a titanium atom in a crystal lattice of the oxide film serving as a passivation film of the titanium alloy. Patent Documents 9 and 10 disclose a technique to form, in rolling processing of a fuel cell separator made of titanium, an altered layer containing titanium carbide on the superficial layer by use of carbon-containing rolling oil, and to form a high-density carbon film thereon to secure conductivity and durability. Thus, conductivity with a carbon paper is increased. However, since durability is secured by the carbon film, making a fine carbon film leads to satisfaction of required performance. The interface between simple carbon and titanium has high contact resistance, and accordingly, titanium carbide that increases conductivity is disposed therebetween. This surface structure can generate a corrosion product that inhibits contact conductivity because the altered layer and the base material cannot be prevented from being corroded in a case in which the carbon film has a defect.

Patent Documents 11, 12, 13, 14, and 15 disclose titanium and a titanium alloy fuel cell separator that is similar to the structure disclosed in Patent Document 9 and has a structure mainly including a carbon layer, a titanium carbide intermediate layer, and a titanium base material laminated in this order. Although a manufacturing process is different from that in Patent Document 9 in that the titanium carbide intermediate layer is formed after the carbon layer is formed in advance, a mechanism of increasing durability by the carbon layer is similar. Patent Document 16 discloses a manufacturing method of applying graphite powder and rolling and annealing the graphite powder for mass production. It can be said that the function of a conventional carbon separator is realized by adding the carbon layer and the titanium carbide intermediate layer to the surface of an unbreakable titanium base material. However, since the titanium carbide intermediate layer has low durability, there remains a concern that this surface structure can generate a corrosion product that inhibits contact conductivity because the intermediate layer and the base material cannot be prevented from being corroded in a case in which the carbon film has a defect. Under such circumstances, Patent Document 17 discloses a technique to dispose titanium carbide and titanium nitride, which are conductive materials, on the surface of titanium, and to cover not only titanium but also the conductive materials with titanium oxide having a passivation function. This invention secures contact conductivity, and in addition, increases durability. However, it is necessary to further increase environmental deterioration resistance of the titanium oxide film covering the conductive materials in order to further lengthen the fuel cell life. Patent Document 18 discloses a titanium material for a polymer electrolyte fuel cell separator in which a coating film made of titanium compound particles and titanium oxide is formed on the surface of a titanium substrate. Patent Document 19 discloses a polymer electrolyte fuel cell separator in which an oxide layer is formed on the surface of pure titanium or a titanium alloy and conductive compound particles are adhered thereto. Patent Document 20 discloses a titanium material for a polymer electrolyte fuel cell separator having a superficial layer structure in which Ti compounds containing C or N are dispersed and the Ti compounds are covered with titanium oxide.

PRIOR ART DOCUMENTS

Patent Documents

[Patent Document 1] JP 2000-328200A
[Patent Document 2] JP 2004-273370A
[Patent Document 3] JP 2007-131947A
[Patent Document 4] JP 2007-5084A
[Patent Document 5] JP 2006-140095A
[Patent Document 6] JP 2007-234244A
[Patent Document 7] JP 2010-97840A
[Patent Document 8] JP 2010-129458A
[Patent Document 9] JP 2010-248570A
[Patent Document 10] JP 2010-248572A
[Patent Document 11] JP 2012-28045A
[Patent Document 12] JP 2012-28046A
[Patent Document 13] JP 2012-43775A
[Patent Document 14] JP 2012-28045A
[Patent Document 15] JP 2012-28047A
[Patent Document 16] JP 2011-77018A
[Patent Document 17] WO2010038544A
[Patent Document 18] WO2011016465A
[Patent Document 19] WO2007145377A
[Patent Document 20] WO2010038544A

SUMMARY OF THE INVENTION

Problems to be Solved by the Invention

As disclosed in Patent Documents 1 to 17, conventionally, techniques to partially or entirely form a covered portion having high conductivity to overcome high contact resistance between titanium or a titanium alloy and carbon, and accordingly, to increase durability. However, the inventors of the present invention returned to a concept that is different from the concept of any of the above Patent Documents, that is, the fundamental principle to increase the durability of titanium. Accordingly, the inventors have been studied mainly to increase the durability by performing passivation treatment on a titanium oxide film, and to disperse and form fine conductive materials in an oxide film on the surface of titanium so that the durability of titanium and also the contact conductivity with carbon can be increased.

Further, the inventors have also intended to develop a technique with high mass productivity so that existing manufacturing lines can be used. Note that Patent Documents 18 to 20 disclose techniques to disperse and form conductive materials in an oxide film on the surface of titanium. However, the techniques disclosed in these documents cannot produce a stable oxide film, and accordingly, the durability is insufficient. In contrast, the present invention aims to develop stabilization treatment that further increases titanium's original durability inducing mechanism, to increase the contact conductivity with carbon as much as possible, and to mass produce a titanium material for a fuel cell separator at a low cost.

Means for Solving the Problem(s)

The preset invention has been made to solve the above problems, and a summary thereof is as follows.

(1) A titanium or titanium alloy material for a fuel cell separator having high contact conductivity with carbon and high durability, the titanium or titanium alloy material including an oxide film formed on a titanium or titanium alloy substrate by stabilization treatment performed after passivation treatment, and one or more kinds selected from carbide, nitride, carbonitride, and boride of tantalum, titanium, vanadium, zirconium, and chromium, the one or more kinds being dispersed in the oxide film and having a major axis diameter from 1 nm to 100 nm. A contact resistance value with a carbon paper is 20 m$\Omega\cdot$cm$^2$ or less at a surface pressure of 10 kgf/cm$^2$ before and after an accelerated deterioration test in which the titanium or titanium alloy material is immersed in a sulfuric acid aqueous solution having an adjusted pH of 4 at 80° C. for four days.

(2) The titanium or titanium alloy material for a fuel cell separator having high contact conductivity with carbon and high durability according to (1), in which carbon is present on a superficial layer of the oxide film, at least one of 2 atomic % or more carbon atoms whose nearest neighboring atom is a double-bond oxygen atom and 10 atomic % or more carbon atoms whose nearest neighboring atom is an oxygen atom of a hydroxyl group is present, and 40 atomic % or less carbon atoms whose nearest neighboring atom is a hydrogen atom of an alkyl group are present.

(3) The titanium or titanium alloy material for a fuel cell separator having high contact conductivity with carbon and high durability according to (1) or (2), in which 1 atomic % or more nitrogen atoms whose nearest neighboring atom is a hydrogen atom are present on the superficial layer of the oxide film.

(4) The titanium or titanium alloy material for a fuel cell separator having high contact conductivity with carbon and high durability according to any one of (1) to (3), in which 1 atomic % or more calcium is present on the superficial layer of the oxide film.

(5) The titanium or titanium alloy material for a fuel cell separator having high contact conductivity with carbon and high durability according to any one of (1) to (4), in which 1 atomic % or more trivalent chromium is present on the superficial layer of the oxide film as oxide or oxyhydroxide.

(6) The titanium or titanium alloy material for a fuel cell separator having high contact conductivity with carbon and high durability according to any one of (1) to (5), in which the passivation treatment is treatment in which the titanium or titanium alloy substrate is immersed in an aqueous solution at 50° C. or more, obtained by mixing one or more selected from 5 mass % or more nitric acid, 1 mass % or more chromic anhydride, and 5 mass % or more sulfuric acid.

(7) The titanium or titanium alloy material for a fuel cell separator having high contact conductivity with carbon and high durability according to any one of (1) to (6), in which the passivation treatment is performed after anode electrolysis is performed on the titanium or titanium alloy substrate in a neutral aqueous solution containing 0.01 mass % or more and 5 mass % or less fluoride ions, or an alkaline aqueous solution having a pH of 12 or more, with a current density from 1 A/m$^2$ to 20 A/m$^2$.

(8) The titanium or titanium alloy material for a fuel cell separator having high contact conductivity with carbon and high durability according to any one of (1) to (7), in which the stabilization treatment is treatment in which the titanium or titanium alloy material is immersed in an aqueous solution at 60° C. or more to which one or more selected from 1 mass ppm or more rice flour, wheat flour, potato starch, corn flour, soy flour, amine-based compounds, aminocarboxylic-acid-based compounds, phospholipid, a commercially available acidic corrosion inhibitor, calcium ions, polyethylene glycol, and starch are added.

(9) A fuel cell separator including the titanium or titanium alloy material for a fuel cell separator having high contact conductivity with carbon and high durability according to any one of (1) to (8) carbon or a carbon-containing conductive film is further added to a surface of the titanium or titanium alloy material.

(10) A manufacturing method for a titanium or titanium alloy material for a fuel cell separator having high contact conductivity with carbon and high durability, the manufacturing method including adding one or more kinds selected from carbide, nitride, carbonitride, and boride of tantalum, titanium, vanadium, zirconium, and chromium to a surface of a titanium or titanium alloy substrate, and then performing passivation treatment in which the substrate is immersed in an aqueous solution obtained my mixing one or more selected from 5 mass % or more nitric acid, 1 mass % or more chromic anhydride, and 5 mass % or more sulfuric acid, and then performing stabilization treatment in which the substrate is immersed in an aqueous solution at 60° C. or more to which one or more selected from 1 mass ppm or more rice flour, wheat flour, potato starch, corn flour, soy flour, amine-based compounds, aminocarboxylic-acid-based compounds, phospholipid, a commercially available acidic corrosion inhibitor, calcium ions, polyethylene glycol, and starch are added.

(11) The manufacturing method for a titanium or titanium alloy material for a fuel cell separator having high contact conductivity with carbon and high durability according to (10), in which, prior to the passivation treatment, passivation pre-treatment is performed in which anode electrolysis is performed on the titanium or titanium alloy substrate, to which the conductive materials have been added, in a neutral aqueous solution containing 0.01 mass % or more and 5 mass % or less fluoride ions, or an alkaline aqueous solution having a pH of 12 or more, with a current density from 1 A/m$^2$ to 20 A/m$^2$.

(12) The manufacturing method for a titanium or titanium alloy material for a fuel cell separator having high contact conductivity with carbon and high durability according to (10) or (11), the manufacturing method further including performing treatment in which carbon or a carbon-containing conductive film is further added to a surface of the titanium or titanium alloy material on which the stabilization treatment has been performed.

Effects of the Invention

According to the present invention, it becomes possible to disperse the conductive materials in the oxide film formed by performing, after the conductive materials are formed on the surface of the titanium or titanium alloy substrate, the passivation pre-treatment as necessary and then performing the passivation treatment and the stabilization treatment. Thus, it becomes possible to provide the titanium or titanium alloy material for a fuel cell separator having high contact conductivity with carbon and high durability. The titanium or titanium alloy material according to the present invention can be processed into a separator to be used as a member of a fuel cell, or can further contain a conductive film after necessary molding process or the like to be used as a fuel cell separator having higher durability. The titanium or titanium alloy material according to the present invention can be provided by mass production with a continuous line, and therefore can be provided at a lower cost than a conventional technique.

BRIEF DESCRIPTION OF THE DRAWING(S)

FIG. 1 is a conceptual diagram showing a cross-sectional structure of a titanium or titanium alloy material for a fuel cell separator according to the present invention.

Figure 2:
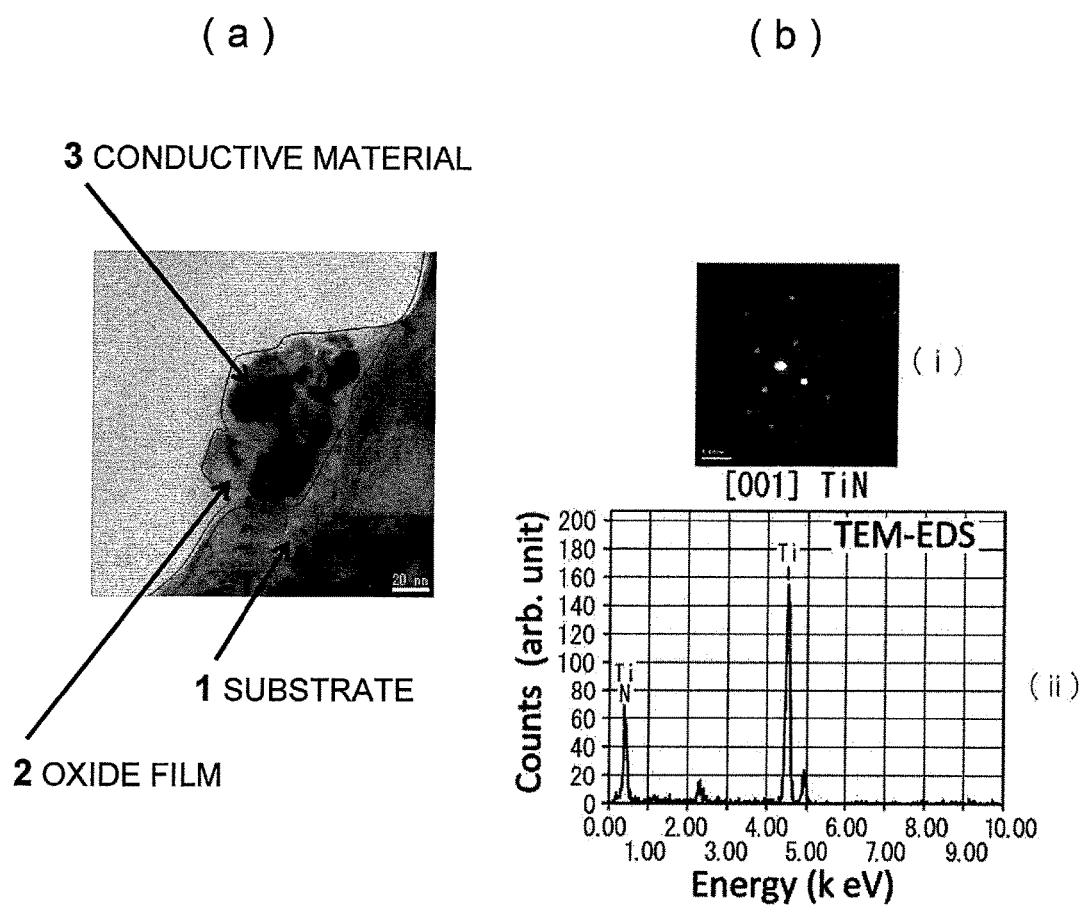

FIG. 2 shows an example of a structure of a titanium or titanium alloy material for a fuel cell separator according to the present invention, and (a) is a transmission electron microscope image showing a cross-sectional structure of an oxide film, and (b) shows (i) an image analyzed by electron diffraction performed in a transmission electron microscope in order to identify conductive materials, and (ii) results of energy dispersive X-ray spectroscopy (TEM-EDS).

MODE(S) FOR CARRYING OUT THE INVENTION

Hereinafter, a titanium or titanium alloy material for a fuel cell separator having high contact conductivity with carbon and high durability according to the present invention will be described in detail with reference to the drawings. FIG. 1 shows a conceptual diagram showing a cross-sectional structure of the titanium or titanium alloy material for a fuel cell separator having high contact conductivity with carbon and high durability according to the present invention. Reference Numeral 1 denotes a substrate made of titanium for industrial use or a titanium alloy, Reference Numeral 2 denotes an oxide film subjected to passivation treatment and stabilization treatment, and Reference Numeral 3 denotes a conductive material.

The titanium or titanium alloy material for a fuel cell separator having high contact conductivity with carbon and high durability according to the present invention is a titanium or titanium alloy material having an oxide film formed by performing stabilization treatment after passivation treatment is performed on a titanium or titanium alloy substrate. Further, in the oxide film, one or more kinds of conductive materials selected from carbide, nitride, carbonitride, and boride of tantalum, titanium, vanadium, zirconium, and chromium having a major axis diameter from 1 nm to 100 nm are dispersed. After the conductive materials are added to the surface of the titanium or titanium alloy substrate, passivation treatment and stabilization treatment are performed thereon, so that the titanium or titanium alloy material having an oxide film in which conductive materials having a certain size are dispersed is obtained.

In order to obtain such an oxide film having high durability and containing fine conductive materials dispersed therein, it is necessary to add conductive materials in advance to the surface of the substrate made of titanium (pure titanium for industrial use) or a titanium alloy prior to the passivation treatment (conductive materials addition treatment) (hereinafter, this treatment may also be referred to as pre-treatment). Examples of the conductive materials include one or more selected from carbide, nitride, carbonitride, and boride of tantalum, vanadium, zirconium, chromium, and titanium.

The following methods can be given as a method of adding such conductive materials to the surface of the titanium or titanium alloy substrate. One or more metal elements selected from tantalum, vanadium, zirconium, and chromium, described above, are alloyed metallurgically with titanium, for example, so as to be present at least on the surface of the substrate, and then, this substrate is heated under an atmosphere in which carbon and/or nitrogen is present, so that conductive materials such as carbide, nitride, or carbonitride of such metal elements are formed on and added to the surface of the substrate. Alternatively, carbide, nitride, or carbonitride of one or more meal elements selected from tantalum, vanadium, zirconium, and chromium is prepared, and then is directly precipitated on the surface of the titanium or titanium alloy substrate by a sputtering method, an ion plating method, or the like. Similarly to carbide, nitride, or carbonitride of titanium, the carbide, nitride, or carbonitride of tantalum, vanadium, zirconium, and chromium lowers contact resistance with a carbon paper by being added to the surface of the titanium or titanium alloy substrate, and accordingly is desirably used as an auxiliary material. In particular, carbide, nitride, and carbonitride of tantalum have high chemical stability under an environment for a fuel cell, and are useful to increase conductive durability.

By such methods, the conductive materials can be formed on the surface of the titanium or titanium alloy substrate.

Note that, without addition of titanium by alloying, modification of the surface, treatment of the surface, and the like, the carbide, nitride, carbonitride of titanium may be formed by performing bright annealing, after cold rolling, with remaining adhesion oil that is used at the time of cold rolling, because the substrate is titanium (for example, see Patent Documents 9 and 10). As the atmosphere for the bright annealing, an argon atmosphere, a nitrogen atmosphere, a hydrogen atmosphere, or the like may be selected freely according to the purpose.

In addition, as for boride of the above described metal elements, boride of a desired metal element may be directly precipitated on the titanium or titanium alloy substrate by a sputtering method, an ion plating method, or the like.

As described above, according to the present invention, the conductive materials may be added in advance to the surface of the substrate made of titanium (pure titanium for industrial use) or a titanium alloy, and a method therefor is not limited to a particular method. Considering treatment in a later process, the conductive materials does not have to be adhered uniformly and homogeneously to the superficial layer of the substrate. The conductive materials may be added to the surface in any way, even in an island shape. In addition, the added amount is not limited to a particular amount either. Yet it is more effective to make the average thickness be 1 µm or more, desirably 5 µm or more.

After the substrate of titanium (pure titanium for industrial use) or a titanium alloy is obtained by adding the conductive materials to the surface as described above, passivation treatment is performed on the substrate. The passivation treatment here means immersion of the substrate, to which the conductive materials are added as described above, in a heated aqueous solution for a certain period of time. The aqueous solution contains one or more selected from 5 mass % or more nitric acid, 1 mass % or more chromic anhydride, and 5 mass % or more sulfuric acid. This treatment aqueous solution generally has a high corrosive property; however, since a stable passivation film is formed on the surface of the metal substrate that is easily passivated, such as titanium, the propagation of corrosion of the titanium substrate is suppressed. In order to perform this treatment, at least a solution having the above composition is needed.

Materials that are present on the surface of the substrate and are likely to undergo a chemical change are removed by this treatment. When the passivation treatment is performed on the titanium or titanium alloy substrate to which the conductive materials are added by the above described pre-treatment, many conductive materials are oxidatively dissolved and removed. Even conductive materials that are unlikely to be oxidized peeled off by the dissolution, if the conductive materials are present on the oxide film of the titanium or titanium alloy substrate having a low protective function.

That is, even if it is the oxide film of the titanium or titanium alloy substrate, the oxide film formed in a bright annealing furnace or in a process prior to the bright annealing process has a low protective function, and is dissolved chemically or electrochemically. In other words, only in a case in which the conductive materials are covered with a stable oxide film formed newly in the above described passivation treatment process, the conductive materials remain after the treatment process. The conductive materials having a small particle size are covered with a passivation titanium oxide film formed by oxidation of titanium ions liquated out newly in the passivation treatment process, and remain in the oxide film dispersedly. In this case, even when the conductive materials are thermodynamically unstable, since the conductive materials are covered with the passivation titanium oxide film, the conductive materials are protected by a corrosive environment in the same manner as the thermodynamically unstable titanium substrate being protected. The inventors focused on phenomena that occur in the passivation treatment process in this manner and used the phenomena, and accordingly have obtained the oxide film in which the fine conductive materials shown in FIG. 1 are dispersed.

In order to perform the passivation treatment efficiently, in a case of using a nitric-acid-based treatment aqueous solution, the concentration of nitric acid needs to be 5 mass % or more, desirably 15 mass % or more, more desirably 30 mass % or more. The upper limit is preferably about 50 mass %. In a case of using a chromic-anhydride-based aqueous solution, the solution is prepared by mixing an acid aqueous solution containing 5 mass % or more sulfuric acid, desirably 15 mass % or more, more desirably 25 mass % or more, with 1 mass % or more chromic acid, desirably 5 mass % or more. The upper limit of the concentration of sulfuric acid is preferably about 70 mass %, and the upper limit of the concentration of chromic acid is preferably about 30 mass %.

Since the passivation treatment may be performed by conveying a stainless steel in addition to a titanium material in a general manufacturing line, a treatment liquid generally contains various impurity ions such as iron ions, chromium ions, nickel ions, or molybdenum ions. It is needless to say that the titanium or titanium alloy substrate to which conductive materials are added is conveyed, so that the substrate also contains impurities originating from the conductive materials, including titanium ions. Since the treatment liquid is an acid liquid having strong oxidizability, the treatment can be performed without any problem even when such impurities are contained; however, considering the stability of production, the sum total of the impurities is desirably managed to be 10 mass % or less of the total.

It is effective to heat the aqueous solution for the passivation treatment at 50° C. or more. To increase productivity, the necessary temperature is considered to be desirably 60° C. or more, more desirably 85° C. or more. The upper limit of the temperature is preferably 120° C. Although depending on the temperature of the aqueous solution, the immersion time is generally 0.5 minutes to 1 minute to be effective. The immersion time is desirably 1 minute or more, more desirably 5 minutes or more. The upper limit of the immersion time is preferably 45 minutes, more preferably about 30 minutes in terms of productivity. Note that, in a case of using a chromic-acid-based treatment liquid, it is found that a smaller addition amount of chromic acid and a higher treatment temperature tend to produce a higher-performance titanium material. Since the state of the conductive materials added by the pre-treatment is considered to differ depending on the material or the treatment method, conditions for the passivation treatment are preferably optimized in accordance with previous processes. Various treatment conditions can be selected.

Prior to application of the above described passivation treatment method, the present inventors found that passivation pre-treatment increases production stability of a titanium or titanium alloy material for fuel cell separator having high contact conductivity with carbon and high durability according to the present invention.

As described above, the conductive materials are added to the surface of the titanium or titanium alloy substrate by the pre-treatment, when this process is performed with a real machine production line, deviations are generated in the surface state (the thickness of a modified layer (conductive-material-added layer), the particle size of the conductive materials, the adhesion of unnecessary materials, and the like) of the titanium or titanium alloy substrate before the passivation treatment (that is, after the pre-treatment). The deviations are generated also under the influence of the condition of real machine equipment, season, whether, and the like. It is necessary to perform the passivation treatment by minimizing the deviations in the surface state in order to manage the production of a high-grade product such as the present invention.

In order to increase the production stability, prior to the passivation treatment, it is preferable to perform anode electrolysis on the pre-treated titanium or titanium alloy substrate in an electrolytic bath of a neutral aqueous solution (pH4 to pH10) or an alkaline aqueous solution having a pH of 12 or more, containing 0.01 mass % or more and 2 mass % or less fluoride ions, with a current density from 1 A/m$^2$ to 20 A/m$^2$. That is, it is preferable to perform passivation pre-treatment.

Although depending on the electrolysis current density, 30° C. or more bath temperature is effective. The higher the bath temperature, the higher the reaction speed becomes. The bath temperature is desirably 40° C. or more, more desirably 50° C. or more. The upper limit of the temperature is preferably about 100° C. It is preferable to set an appropriate temperature, current density, treatment time, and the like, considering the heat resistant limit of an electrolytic bath container.

In a case of using a neutral solution as the electrolytic bath, ammonium fluoride, sodium fluoride, potassium fluoride, lithium fluoride, or the like is used as a fluoride ion source. When the fluoride ion has a low concentration, oxide and a gross conductive material which are to be removed from the surface of titanium are not removed. When treatment was performed by use of an ammonium fluoride aqueous solution at 50° C. containing 0.005 mass % fluoride ions with various current densities, satisfactory results were not obtained. A high concentration causes a conductive material that is to remain to be removed, and also causes the substrate to be corroded. When anode electrolysis treatment was performed by use of an ammonium fluoride aqueous solution at 50° C. containing 7 mass % fluoride ions with a current density of 1 A/m$^2$, the titanium substrate was corroded. Accordingly, the fluoride ions have an appropriate concentration range from 0.001 mass % to 5 mass %, desirably from 0.2 mass % to 2 mass %, more desirably 1±0.5 mass %.

In a case of using an alkaline solution as the electrolytic bath, sodium hydroxide, potassium hydroxide, or the like can be used. When pH is less than 12, pH tends to be decreased over time by absorption of a carbon dioxide gas from the air, and the decrease in pH decreases the reaction speed. Accordingly, the load on production management is increased. When, as preliminary experiment, anode electrolysis treatment was performed by use of pH10 and pH11 sodium hydroxide aqueous solutions with various current densities, desirable modification effects were not obtained because dissolution of the oxide film was insufficient in each case. Therefore, it is preferable for the electrolytic bath to keep pH12 or more, desirably pH13 or more, more desirably pH13.5 or more.

A low current density needs a long period of time for treatment. A too high current density leads to potential shift to a potential at which another electrochemical reaction such as an oxygen evolution reaction occurs before treatment progresses. Accordingly, the appropriate range is from 1 A/m$^2$ to 20 A/m$^2$, preferably from 1 A/m$^2$ to 10 A/m$^2$. In this case, the treatment time for anode electrolysis is about 1 to 20 minutes, preferably 2 to 10 minutes. The passivation pre-treatment is an effective measure to control quality by stabilization of production and also a useful technique for mass production. Considering productivity, the current density is preferably adjusted such that the treatment time for anode electrolysis is within 5 minutes.

After performing the passivation pre-treatment as necessary on various titanium substrates to which the conductive materials are added by the above described pre-treatment, by performing the passivation treatment, initial contact conductivity with carbon can be increased to the same level as that of a noble metal. However, there has remained a problem in that the durability is insufficient. The present inventors have thoroughly investigated the factor by electrochemical analysis. The factor is found to be as follows. Owing to a minute amount of active excess oxygen (hereinafter also referred to as active oxygen) that remains in the oxide film formed on the surface of the titanium or titanium alloy substrate, a space of an atomic size generated in the oxide film allows atoms in the passivation film to move easily, so that the passivation film was made unstable, and fine conductive materials in the oxide film are corroded. As a result, it is found that a corrosion product of the conductive materials re-adheres to the surface of titanium or the titanium alloy, and decreases the contact conductivity with carbon. Accordingly, the present inventors have attempted stabilization treatment in which materials containing amine-based compounds, aminocarboxylic-acid-based compounds, phospholipid, starch, and the like, which are said to deactivate active oxygen, are added to an aqueous solution, the aqueous solution is heated at 40° C. or more, and a titanium material on which the passivation treatment is performed is immersed in the heated aqueous solution.

Accordingly, rice flour, wheat flour, potato starch, corn flour, soy flour, an acidic corrosion inhibitor, and the like were found to be effective for the stabilization treatment. These substances derived from natural products and artificial synthetic substances contain one or more selected from amine-based compounds, aminocarboxylic-acid-based compounds, phospholipid, starch, calcium ions, and polyethylene glycol, which are also effective for the stabilization treatment. Note that an aqueous solution that contained none of these compounds did not produce stabilization effects in treatment at any temperature or for any period of time.

Examples of the amine-based compounds include polymer amine-based compounds such as hydroxylamine, hydrazine, guanine, monomethylamine, dimethylamine, trimethylamine, monoethylamine, triethylamine, mono-n-propylamine, di-n-propylamine, tri-n-propylamine, mono-n-butylamine, di-n-butylamine, tri-n-butylamine, 2-ethylhexylamine, 3-ethoxypropylamine, t-butylamine, ethylenediamine, hexamethylene diamine, triethylenediamine, monoethanolamine, diethanolamine, triethanolamine, monoisopropanolamine, diisopropanolamine, triisopropanolamine, N,N-dimethyl ethanolamine, N,N-diethyl ethanolamine, cyclohexylamine, o-aminophenol, m-aminophenol, p-aminophenol, o-phenylenediamine, m-phenylenediamine, p-phenylenediamine, o-xylenediamine, m-xylenediamine, p-xylenediamine, piperazine, piperidine, morpholine, N-methylmorpholine, N-ethylmorpholine, polyalkylene polyamines, and the like.

Examples of the aminocarboxylic-acid-based compounds include L-glycine, L-alanine, L-valine, L-phenylalanine, L-tryptophan, L-serine, L-tyrosine, L-cysteine, L-aspartic acid, L-glutamic acid, L-histidine, L-lysine, and the like.

Examples of the phospholipid include phosphatidylcholine (acetylcholine), phosphatidylethanolamine (cephalin), phosphatidylinositol, phosphatidylserine, phosphatidylglycerol, sphingomyelin, and the like.

Examples of the acidic corrosion inhibitor include Hibiron (Japanese Registered Trademark No. 4787376) produced by Sugimura Chemical Industrial Co., Ltd., Ibit (Japanese Registered Trademark No. 2686586) produced by ASAHI Chemical Co., Ltd., Kilesbit (Japanese Registered Trademark No. 4305166) produced by Chelest Corporation, and the like, which are commercially available. Note that the present invention is not limited to these product names or product numbers.

Although detailed components of commercially available acidic corrosion inhibitor are not made public, the stabilization treatment liquid may be obtained by preparing an aqueous solution containing 0.001 mass % or more, desirably 0.01 mass % or more, of one or more acidic corrosion inhibitors as a volume of product. It is needless to say that the stabilization treatment liquid may alternatively be obtained by preparing one or more selected from 1 mass ppm or more above described individual compounds. Note that the upper limit of the concentration of the stabilization treatment liquid is preferably about 1.0 mass %. It is possible to further add calcium ions in a form of compounds such as carbonate, hydrocarbonate, hydroxide, and oxide. Considering the effects, productivity, cost, and the like, the details of the component can be freely selected in order to be optimized.

The effects emerge when the treatment time lasts for 0.5 minutes to 1 minute; however, the treatment time is preferably 1 minute or more, desirably 3 minutes or more, more desirably 5 minutes or more. The heating becomes more effective as the temperature is higher, which is 60° C. or more, preferably 70° C. or more, desirably 90° C. or more, more desirably 98° C. or more. The upper limit of the treatment temperature is preferably 100° C. Note that sufficient effects were not produced at 50° C. or lower. The stabilization treatment plays an important role to increase the durability of titanium or a titanium alloy according to the present invention.

By use of the titanium or titanium alloy material for a fuel cell separator having high contact conductivity with carbon and high durability according to the present invention, which is obtained through the above processes, a cross-sectional thin film sample for TEM was fabricated by a focused ion beam (FIB) method, and the sample was observed by a 200-kV field emission type transmission electron microscope (FE-TEM) equipped with an energy dispersive X-ray spectroscope (EDS). Further, based on a structural analysis by an electron diffraction pattern and an image observed by the electron microscope, particle size distribution was measured. As a result of the analysis, it was found that the oxide film is a rutile or an anatase and that the conductive materials having a major axis diameter from 1 nm to 100 nm are dispersed in the oxide film on the surface of the substrate formed by performing the stabilization treatment after the passivation treatment.

Further, in some cases, voids having a major axis diameter of about 50 nm or more were observed in the vicinity of the interface between the substrate and the oxide film or in the oxide film. The void is not necessarily needed in terms of function, but may be generated by performing the passivation treatment on titanium that is subjected to the pre-treatment in which the conductive materials are added, as described above. That is, this can be regarded as a trace of dissolution and isolation of unstable gross conductive materials in the passivation treatment process. The periphery of the remaining and dispersed conductive materials having a major axis diameter from 1 nm to 100 nm is covered with titanium oxide or amorphous titanium oxide that is identified as a rutile or an anatase. Accordingly, the conductive materials are determined to be passivated in addition to the titanium substrate. The remaining unstable gross conductive materials are corroded to be a corrosion product, which is adhered to the surface and decreases contact conductivity.

The rutile or anatase included in the oxide film is a semiconductor having low conductivity. However, it is considered that, when fine conductive materials are dispersed therein, a phenomenon such as a tunnel effect or resonance of electron clouds occurs between the conductive materials, which facilitates electron transfer.

Conductive materials that are present in the film and have a too big particle size, which is more than 100 nm, or a too small particle size, which is less than 1 nm, are likely to exit in the passivation treatment process. Accordingly, conductive materials having a major axis diameter from 1 nm to 100 nm are considered to remain in the passivation film.

In a case in which the above described conductive materials are present dispersedly in the film, the contact resistance value with a carbon paper is found to be 20 m$\Omega \cdot cm^2$ or less at a surface pressure of 10 kgf/$cm^2$. Note that, when a plurality of different fields of view are observed in a manner that the sum length of observed portions along the surface of the substrate of the cross-sectional superficial layer of the titanium or titanium alloy substrate, which is observed by the 200-kV field emission type transmission electron microscope (FE-TEM), is 5 μm, at least one conductive material has to be observed in the plurality of different fields of view in the film of the titanium or titanium alloy material. The number of observed conductive materials is preferably ten or more in total, desirably twenty or more in total, more desirably fifty or more in total.

Owing to functions of amine-based compounds, aminocarboxylic-acid-based compounds, and the like, contained in a treatment agent used in the stabilization treatment, the stabilization treatment according to the present invention enables the detection of the presence of carbon (C) and nitrogen (N) on the superficial layer of the oxide film of the titanium or titanium alloy substrate. An X-ray electron spectroscopy (XPS) can be used as a detection method. Note that the superficial layer mentioned here means a depth region obtained by XPS measurement without sputtering, which is about 0.6 mm in depth. A carbon atom on the superficial layer can be detected as at least one of the following forms: a carbon tom whose nearest neighbor atom is a double-bond oxygen atom (=O), a carbon atom whose neighbor atom is an oxygen atom of a hydroxyl group (—OH), and a carbon atom whose neighbor atom is a hydrogen atom (—H) of an alkyl group. A nitrogen atom on the superficial layer can be detected as nitrogen whose nearest neighbor atom is a hydrogen atom (—H). Note that the above states are not always detected depending on sensitivity. When titanium is rolled and annealed in a factory, a minute amount of rolling oil, oil floating in the factory, and the like is adhered on the surface. Accordingly, the minute amount of oil remains on the surface of a general titanium or titanium alloy rolled material. In this case, the existence state of a carbon atom on the superficial layer has a high fraction of carbon atoms whose nearest neighboring atom is hydrogen of an alkyl group. The passivation treatment and the stabilization treatment described in the present invention remove the initial remaining oil and replace the oil with an adsorbed organic molecule obtained by the stabilization treatment. As a result, the fraction of carbon atoms whose nearest neighboring atom is hydrogen of an alkyl group becomes about 40 atomic % or less. Because of the adsorption of the amine-based compounds or the aminocarboxylic-acid-based compounds, the fraction of carbon atoms whose nearest neighboring atom is a double-bond oxygen atom (=O) and the fraction of carbon atoms whose nearest neighboring atom is an oxygen atom of a hydroxyl group (—OH) are increased to be about 2 atomic % or more and about 10 atomic % or more, respectively.

It is considered that a stabilization treatment agent adsorbs and bonds active oxygen that can easily move in the oxide film, and suppresses the movement of oxygen and titanium. Accordingly, it is found that the stabilization treatment is sufficiently performed and an increase in durability is secured.

In a case of attempting to increase corrosion resistance to fluoride even if only slightly, calcium ions can be intentionally added to the stabilization treatment agent in a form of calcium carbonate, calcium hydroxide, or calcium oxide. Without such intentional addition, there may be cases in which calcium ions are contained in rice flour, wheat flour, potato starch, corn flour, soy flour, which are natural products, and a commercially available acidic corrosion inhibitor, which is an industrial product. When tap water, industrial water, well water, or the like is used to produce an aqueous solution for the stabilization treatment, it inevitably obtains calcium ions. Accordingly, when the stabilization treatment is performed, it becomes possible to detect the presence of calcium on the superficial layer (hereinafter also referred to as surface calcium) although the amount is minute. The calcium on the surface reacts with fluoride ions generated by degradation decomposition of MEA and is insolubilized as fluoride calcium, and accordingly is considered to be effective in increasing corrosion resistance to fluoride. That is, in this manner, it can be revealed that the increase in durability is secured.

In a case in which a heated aqueous solution containing chromic acid is used when performing the passivation treatment, in some cases, a trivalent chromium atom is present as oxide or oxyhydroxide on the superficial layer of the oxide film after the stabilization treatment (hereinafter also referred to as chromium(III) on the superficial layer) and 1 atomic % or more chromium(III) on the superficial layer is detected by XPS. Note that a soluble hexavalent chromium material (hereinafter also referred to as chromium (VI) on the superficial layer) is washed off by performing the stabilization treatment and is not detected. If chromium(VI) on the superficial layer is detected, it is preferable that the stabilization treatment is regarded as being insufficient and that the conditions for the stabilization treatment are optimized by adjusting the temperature or time so that hexavalent chromium is not detected. In this manner, the stabilization treatment according to the present invention has an aspect of washing using heated water containing a minute amount of additive components. Therefore, it is preferable to perform sufficient stabilization treatment while productivity is taken into consideration so as not to be inhibited. Thus, it is revealed that the stabilization treatment is surely performed on the oxide film and that the durability is increased.

Here, the atomic % value obtained by the above described XPS is a fraction of each state of each element obtained when the sum total of the value obtained by dividing a peak area, corresponding to each state of all elements detected by measuring spectra of the whole range, by a correction coefficient corresponding to sensitivity per unit number of atoms of each state of each element, is standardized as 100 atomic %. Since it is principally impossible to perform strict quantitative evaluation in association with the real number of atoms by XPS, the numerical value of the atomic number ratio is calculated by this convenient method. In some cases, different values become an appropriate value as the correction coefficient depending on the sensitivity of an apparatus, so that a calibration curve is created and set by use of a standard substance whose components are known. In a case in which complex bonding occur between atoms, an analyzing technique such as isolation of adjacent peaks is necessary. The titanium or titanium alloy on which the stabilization treatment according to the present invention has been performed contains, on the superficial layer of the oxide film, at least one of 2 atomic % or more carbon atoms whose nearest neighboring atom is a double-bond oxygen atom (the upper limit thereof is not limited to a particular value, but is usually about 10 atomic %), 10 atomic % or more carbon atoms whose nearest neighboring atom is an oxygen atom of a hydroxyl group (the upper limit thereof is not limited to a particular value, but is usually about 25 atomic %), and 40 atomic % or less carbon atoms whose nearest neighboring atom is a hydrogen atom of an alkyl group (the lower limit thereof is not limited to a particular value, but is usually about 10 atomic %), as a characteristic of a substance. Further, 1 atomic % or more nitrogen atoms whose nearest neighboring atom is a hydrogen atom may be present. The superficial layer may contain 1 atomic % or more calcium atoms. The upper limit of the nitrogen atoms and calcium atoms are not limited to a particular value, but is usually about 10 atomic %. Checking the existence state of atoms of these elements makes it possible to determine whether or not the stabilization treatment has been performed sufficiently on the oxide film according to the present invention, and to ensure the increase in durability. Further, in a case in which the passivation treatment is performed by use of a liquid containing chromic anhydride, 1 atomic % or more chromium(III) on the superficial layer may be detected. Accordingly, it becomes possible to check what kind of method has been used for the stabilization treatment. Note that the upper limit of chromium(III) atoms is not limited to a particular value, but is usually about 10 atomic %.

As for the thus produced titanium or titanium alloy material for a fuel cell separator having high contact conductivity with carbon and high durability, the contact resistance value with a carbon paper is 20 m$\Omega \cdot$cm$^2$ or less at a surface pressure of 10 kgf/cm$^2$ before and after an accelerated deterioration test in which the titanium or titanium alloy material is immersed in a sulfuric acid aqueous solution having an adjusted pH of 4 at 80° C. for four days. Note that the contact resistance value changes depending on the carbon paper that is used, and TGP-H-120 manufactured by Toray Industries, Inc. is used here as a reference. That is, in Examples described later, all carbon papers that are used when the contact resistance was measured were TGP-H-120 manufactured by Toray Industries, Inc. The reason for this is as follows. That is, the contact resistance value of the titanium or titanium alloy material for a fuel cell separator changes largely depending on a carbon paper. Accordingly, when contact resistance values measured by use of different carbon papers are compared with each other, it is impossible to determine superiority and inferiority of the characteristics of the titanium or titanium alloy material for a fuel cell separator. Therefore, in the Examples, TGP-H-120 manufactured by Toray Industries, Inc. was used as all the carbon papers.

A standard contact resistance value for this determination is desirably 15 m$\Omega \cdot$cm$^2$ or less, more desirably 10 m$\Omega \cdot$cm$^2$ or less, and a highest performance region is 5 m$\Omega \cdot$cm$^2$ or less.

When the contact resistance value is within a range of 20 m$\Omega \cdot$cm$^2$ or less before and after the accelerated deterioration test, from laboratory test results so far, it can be expected that the titanium or titanium alloy material can endure a 5000-hour endurance-power-generation test even when being incorporated as a separator in a polymer electrolyte fuel cell. In contrast, when a titanium material whose contact resistance value is beyond this range is incorporated as a separator in a polymer electrolyte fuel cell, before the endurance-power-generation test reaches 5000 hours, a titanium corrosion product may be newly generated and adhered on the surface to change the color thereof, and the contact conductivity with carbon is decreased dramatically. In order to keep a lower contact resistance value for a longer time, it is preferable to lower the standard value for the determination of contact resistance. The lower contact resistance value is more preferable, and, as can be seen from the Examples, according to the present invention, it becomes possible to achieve 5 m$\Omega \cdot$cm$^2$ or less.

In a laboratory fuel cell power-generation test, the present inventors have found a correlation such that the contact resistance value of 10 m$\Omega \cdot$cm$^2$ or less leads to the maintenance of favorable contact conductivity with carbon, which is about 10000 hours or more, and that the contact resistance value of 5 m$\Omega \cdot$cm$^2$ or less leads to the maintenance of favorable contact conductivity with carbon, which is about 20000 hours or more.

The titanium or titanium alloy material for a fuel cell separator according to the present invention has excellent conductivity and durability as described above, and thus can be used extremely efficiently as a separator material for a fuel cell.

In the above described endurance-power-generation test as the laboratory fuel cell power-generation test, influence of externally mixed corrosive substances such as chloride ions, sulfur oxide, and fluoride ions generated by decomposition of MEA, is not taken into consideration. In order to make a polymer electrolyte fuel cell that can be built in a real machine or a real car, which can include such corrosive substances, it is desirable to further increase the durability. Accordingly, it is preferable to prepare the fuel cell separator by performing treatment (hereinafter also referred to as post-treatment) in which carbon or a conductive film such as a film containing carbon is added to the surface of the above described titanium or titanium alloy material for a fuel cell separator having high contact conductivity with carbon and high durability.

The fuel cell separator produced by the above method has a surface that has as high contact conductivity and durability as a conventional carbon separator, and further is unlikely to break as a separator, which facilitates quality assurance as a fuel cell. Because titanium or a titanium alloy is used as the substrate in the present invention, even if a carbon film or a carbon-containing film has a defect, the highly durable oxide film that has been subjected to the passivation treatment and the stabilization treatment is present right below the carbon film or the carbon-containing film; therefore, the titanium or titanium alloy substrate is protected. Accordingly, corrosion is more suppressed than in a conventional art, and it becomes possible to solve the problem of an increase in contact resistance, concerned for a titanium or titanium alloy fuel cell separator that mainly include a stack of a carbon layer, a titanium carbide intermediate layer, and a titanium base material laminated in this order, as described in the background of the subject application, due to adherence of a corrosion product of the titanium carbide intermediate layer on the surface.

Further, carbon or the carbon-containing film does not always need to be added to the entire surface of the separator. For example, carbon or the carbon-containing film may be locally added to a projection portion of the separator, that is, the surface that contacts with a gas diffusion layer made of a carbon-paper. In order to form a carbon film, for example, carbon atoms that are ionized by an ion plating method or the like may be deposited on the surface of the separator. In order to from the carbon-containing film, for example, a solvent coating material containing highly conductive carbon powder is applied by spraying, and is subjected to baking curing treatment. When high deformation is performed on such carbon-based film, the carbon-based film might break, so that it is desirable that treatment is performed after the carbon-based film is processed into the shape of the separator.

The fuel cell separator according to the present invention uses a titanium material for a fuel cell separator having high contact conductivity with carbon and high durability according to the present invention, and the method of adding carbon or the carbon-containing film is not limited to the above method and a variety of methods can be selected.

EXAMPLES

The present invention will be specifically described with reference to the Examples below. In order to check the structure, characteristics, and the like of the titanium or titanium alloy material for a separator according to the present invention, conditions of the substrate, the pre-treatment (conductive materials addition treatment), the passivation pre-treatment, the passivation treatment, the stabilization treatment, and the post-treatment (conductive film addition treatment) are changed in a wide range and titanium or titanium alloy materials (test materials) for a separator of various modes were fabricated.

The specific contents are shown in Table 1 to Table 14 by use of three characters and numbers as implement numbers for each condition of the substrate, the pre-treatment (conductive materials addition treatment), the passivation pre-treatment, the passivation treatment, the stabilization treatment, and the post treatment (conductive film addition treatment).

[Substrate]
The following substrates were used as test materials.
M01: titanium (JIS H 4600 type 1 TP270C) industrial pure titanium type 1
M02: titanium (JIS H 4600 type 2 TP340C) industrial pure titanium type 2
M03: titanium (JIS H 4600 type 3 TP480C) industrial pure titanium type 3
M04: titanium (JIS H 4600 type 4 TP550C) industrial pure titanium type 4
M05: titanium alloy (corresponding to JIS H 4600 type 60) 6 mass % Al-4 mass % V—Ti
M06: titanium alloy (corresponding to JIS H 4600 type 16) 5 mass % Ta—Ti
Note: "corresponding" in the JIS standard description of the titanium alloys means being a substrate that is obtained by molding laboratorially and hot-rolling and cold-rolling.

[Pre-Treatment (Conductive Materials Addition Treatment)]
The treatment of adding conductive materials were performed as follows.
P01: Obtained by, after performing cold-rolling to a thickness of 0.1 mm, without removing rolling oil, performing bright annealing treatment in an Ar atmosphere at 800° C. for 20 seconds.
P01*: Obtained in the same manner as P01, and a sample was extracted from a portion where much rolling oil was adhered. Had a surface that was blacker than a generally obtained P01 treatment material.
P02: Obtained by, after performing cold-rolling to a thickness of 0.1 mm, without removing rolling oil, performing bright annealing treatment in a $N_2$ atmosphere at 800° C. for 20 seconds.
P03: Obtained by, after performing cold-rolling to a thickness of 0.1 mm and washing off and removing rolling oil, precipitating TiC by ion-plating.
P04: Obtained by, after performing cold-rolling to a thickness of 0.1 mm and washing off and removing rolling oil, precipitating TiN by ion-plating.
P05: Obtained by, after performing cold-rolling to a thickness of 0.1 mm and washing off and removing rolling oil, precipitating TiCN by ion-plating.
P06: Obtained by, after performing cold-rolling to a thickness of 0.1 mm and washing off and removing rolling oil, precipitating TaC by ion-plating.
P07: Obtained by, after performing cold-rolling to a thickness of 0.1 mm and washing off and removing rolling oil, precipitating TaN by ion-plating.
P08: Obtained by, after performing cold-rolling to a thickness of 0.1 mm and washing off and removing rolling oil, precipitating TaCN by ion-plating.
P09: Obtained by, after performing cold-rolling to a thickness of 0.1 mm and washing off and removing rolling oil, precipitating CrB by ion-plating.
P10: Obtained by, after performing cold-rolling to a thickness of 0.1 mm and washing off and removing rolling oil, precipitating ZrB by sputtering.
Note: The thickness of the substrate before performing cold-rolling was 0.3 mm or more.
Note: In a case of washing off rolling oil, a commercially available alkaline degreasing agent was used.
Note: The precipitated thickness by ion-plating, sputtering, or vacuum deposition was 1 to 20 μm per side on average.

[Passivation Treatment]
The following aqueous solutions were used for the passivation treatment.
A01: Aqueous solution containing 30 mass % nitric acid (laboratory solution).
A02: Aqueous solution containing 20 mass % nitric acid (laboratory solution).
A03: Aqueous solution containing 10 mass % nitric acid (laboratory solution).
A04: Aqueous solution containing 5 mass % nitric acid (laboratory solution).
A05: Mixed aqueous solution containing 25 mass % chromic anhydride, and 50 mass % nitric acid (laboratory solution).
A06: Mixed aqueous solution containing 25 mass % chromic anhydride, and 50 mass % nitric acid (factory solution).
A07: Mixed aqueous solution containing 15 mass % chromic anhydride, and 50 mass % nitric acid (factory solution).
A08: Mixed aqueous solution containing 15 mass % chromic anhydride, and 70 mass % nitric acid (factory solution).
A09: Mixed aqueous solution containing 5 mass % chromic anhydride and 50 mass % nitric acid (factory solution).
A10: Mixed aqueous solution containing 5 mass % chromic anhydride and 70 mass % nitric acid (factory solution).
A11: Mixed aqueous solution containing 5 mass % nitric acid, 5 mass % chromic anhydride, and 50 mass % sulfuric acid (laboratory solution).

A12: Mixed aqueous solution containing 5 mass % nitric acid, 1 mass % chromic anhydride, and 5 mass % sulfuric acid (laboratory solution).
Note: In any case, in a case in which a solid is generated, the solution was used with the solid dispersed in the solution.
Note: "Laboratory solution" means an aqueous solution created actually by preparing reagents laboratorically.
Note: "Factory solution" means an aqueous solution that is being used in a factory and was used for treatment in real machine. The factory solution contains 10 mass % or less impurities in total, such as iron ions, chromium ions, nickel ions, and molybdenum ions.
Note: Temperatures of the aqueous solutions were changed from 40 to 120° C., and immersion treatment times were changed from 0.5 to 25 minutes.

[Stabilization Treatment]

The following aqueous solutions were used for the stabilization treatment.
B01: 0.25 mass % rice flour, remnant is deionized water.
B02: 0.25 mass % wheat flour, remnant is deionized water.
B03: 0.25 mass % potato starch, remnant is deionized water.
B04: 0.25 mass % corn flour, remnant is deionized water.
B05: 0.25 mass % soy flour, remnant is deionized water.
B06: 0.02 mass % polyethylene glycol, 0.05 mass % rice flour, 0.0001 mass % calcium carbonate, 0.0001 mass % calcium hydroxide, 0.0001 mass % calcium oxide, remnant is distilled water.
B07: 0.10 mass % acidic corrosion inhibitor [produced by Sugimura Chemical Industrial Co., Ltd., Hibiron (Japanese Registered Trademark No. 4787376) AS-20K], remnant is deionized water.
B08: 0.05 mass % acidic corrosion inhibitor [produced by Sugimura Chemical Industrial Co., Ltd., Hibiron (Japanese Registered Trademark No. 4787376) AS-35N], remnant is deionized water.
B09: 0.08 mass % acidic corrosion inhibitor [produced by Sugimura Chemical Industrial Co., Ltd., Hibiron (Japanese Registered Trademark No. 4787376) AS-25C], remnant is tap water.
B10: 0.10 mass % acidic corrosion inhibitor [produced by Sugimura Chemical Industrial Co., Ltd., Hibiron (Japanese Registered Trademark No. 4787376) AS-561], remnant is tap water.
B11: 0.30 mass % acidic corrosion inhibitor [produced by Sugimura Chemical Industrial Co., Ltd., Hibiron (Japanese Registered Trademark No. 4787376) AS-561], remnant is tap water.
B12: 0.01 mass % acidic corrosion inhibitor [produced by Chelest Corporation, Kilesbit (Japanese Registered Trademark No. 4305166) 17C-2], remnant is tap water.
B13: 0.04 mass % acidic corrosion inhibitor (produced by ASAHI Chemical Co., Ltd., Ibit (Japanese Registered Trademark No. 2686586) New Hyper DS-1), remnant is tap water.
Note: In any case, in a case in which a solid is generated, the solution was used with the solid dispersed in the solution.
Note: Temperatures of the aqueous solutions were changed from 40 to 100° C., and immersion treatment times were changed from 1 to 10 minutes.

[Passivation Pre-Treatment]

The following aqueous solutions were used for the passivation pre-treatment.
F01: neutral aqueous solution containing 0.01 mass % fluoride ions, prepared by adding ammonium fluoride.
F02: neutral aqueous solution containing 0.03 mass % fluoride ions, prepared by adding ammonium fluoride.
F03: neutral aqueous solution containing 0.1 mass % fluoride ions, prepared by adding ammonium fluoride.
F04: neutral aqueous solution containing 0.3 mass % fluoride ions, prepared by adding ammonium fluoride.
F05: neutral aqueous solution containing 1 mass % fluoride ions, prepared by adding ammonium fluoride.
F06: neutral aqueous solution containing 2 mass % fluoride ions, prepared by adding ammonium fluoride.
F07: neutral aqueous solution containing 5 mass % fluoride ions, prepared by adding ammonium fluoride.
F08: neutral aqueous solution containing 1 mass % fluoride ions, prepared by adding lithium fluoride.
F09: neutral aqueous solution containing 1 mass % fluoride ions, prepared by adding potassium fluoride.
F10: neutral aqueous solution containing 1 mass % fluoride ions, prepared by adding sodium fluoride.
D01: pH12 alkaline aqueous solution containing sodium hydroxide.
D02: pH13 alkaline aqueous solution containing sodium hydroxide.
D03: pH13.5 alkaline aqueous solution containing sodium hydroxide.
D04: pH12 alkaline aqueous solution containing potassium hydroxide.
D05: pH13 alkaline aqueous solution containing potassium hydroxide.
D06: pH13.5 alkaline aqueous solution containing potassium hydroxide.
Note: These aqueous solutions were prepared by use of well water, and contain 5 mass % or less inevitable impurities such as silicic acid and calcium.
Note: "neutral" here means a range from pH4 to pH10, and as far as the pH is in this range, pH is not adjusted particularly.
Note: pH of the alkaline aqueous solutions was controlled by the addition amount of certain hydroxide.
Note: Temperatures of the aqueous solutions were changed from 30 to 50° C., immersion treatment times were changed from 2 to 35 minutes, and current densities were changed from 1 to 10 A/m$^2$.

[Post-Treatment]

Adding methods were as follows in the conductive film addition treatment.
Q01: A carbon film with an average thickness of two microns was added by an ion plating method.
Q02: A coating material obtained by mixing conductive carbon with an epoxy-based resin was applied by spraying, and was subjected to baking curing at 200° C. for 10 minutes, so that a conductive coating film with an average thickness of five microns was added.

[Identification Analyzing Method and Function Evaluating Method]

From the test materials fabricated under the above described conditions, test pieces of a certain size were extracted, and the followings were measured by later described methods: basic structures of the oxide film, kinds of conductive materials in the oxide film, presence state of carbon (C) atoms on the superficial layer of the oxide film, presence state of nitrogen (N) atoms, presence state of calcium (Ca) atoms, presence state of chromium (Cr) atoms, and contact resistance values before and after an accelerated deterioration test.

The basic structures of the oxide film and kinds of conductive materials were observed and checked by a 200-kV field emission type transmission electron microscope (FE-TEM) equipped with an energy dispersive X-ray spectroscope (EDS), by fabricating thin film samples for TEM by use of a FIB method, as described above. Note that in a case in which the determination was difficult because the crystal structures are alike or X-ray spectra overlap with each other, the conductive materials were determined comprehensively by considering the results of analysis by XPS.

The presence state of carbon atoms on the superficial layer, the presence state of nitrogen on the superficial layer, the presence state of chromium on the superficial layer, and the presence state of calcium on the superficial layer were checked by analyzing the surface by XPS.

The contact conductivity was checked by obtaining contact resistance values (unit: $m\Omega\cdot cm^2$) in the following manner. A carbon paper as a reference and a test piece (sample) were laminated, this laminate was sandwiched by two metallic parts made by plating copper with gold, at a certain pressure, direct current (unit: A) that is the same value as the contact area value (unit: $cm^2$) between the sample and the carbon paper was flowed between the two gold-plated copper parts, and a voltage drop generated at a connection part of the gold-plated copper parts, the carbon paper, and the test piece was measured.

The accelerated deterioration test in which the immersion in a sulfuric acid aqueous solution having an adjusted pH of 4 at 80° C. for four days was performed as follows. A sulfuric acid aqueous solution having an adjusted pH of 4 was put into a plastic container (about 38 mm internal diameter×75 mm height) for placing the sulfuric acid aqueous solution in a constant temperature water bath that can be kept at 80° C., and a test piece (about 30 mm×50 mm) of a size that fits the plastic container was immersed therein for a certain period of time (four days). After that, the contact resistance value (unit: $m\Omega\cdot cm^2$) of this test piece was measured in the above described manner. Note that the contact resistance value of the same test piece was measured before and after the accelerated deterioration test.

The results are shown in rows of "Substance characteristics" and "Contact conductivity" in Table 1 to Table 14. Note that in these tables, it was determined whether or not the structure or the contact conductivity of the oxide film of the test material complies with the regulations of the present invention, and the results are shown by Y (comply) and N (not comply).

Table 1 shows an example (implement numbers 101 to 105) in which only the passivation treatment was performed as a comparative example, and in any case in which the stabilization treatment is not performed, the regulations for the basic structure and the contact conductivity of the oxide film according to the present invention are not satisfied.

Table 2 shows an example in which the passivation treatment and the stabilization treatment were performed, in which case, even when the time for the passivation treatment was as short as 0.5 minutes (Invention Example: implement number [201]), the oxide film was formed and certain contact conductivity was obtained.

Table 3 and Table 4 show examples in which the passivation treatment and the stabilization treatment were performed, and in a case in which the temperature of the aqueous solution in the passivation treatment in Table 3 was lower than 50° C. (Comparative Example: implement number [301]), the stabilization treatment was insufficient and sufficient contact conductivity was not obtained. However, in a case in which the temperature of the aqueous solution was 50° C. or more, sufficient contact conductivity was obtained.

Table 5 shows an example in which the passivation treatment and the stabilization treatment were performed, in which case, even when the time for the stabilization treatment was as short as 0.5 minutes (Invention Example: implement number [501]), the stabilization treatment was performed and certain contact conductivity was obtained.

Table 6 and Table 7 show examples in which the passivation treatment and the stabilization treatment were performed, and in a case in which the temperature of the aqueous solution in the stabilization treatment was lower than 60° C. (Comparative Example: implement numbers [601] and [602]), the stabilization treatment was insufficient and sufficient contact conductivity was not obtained.

Table 8 shows an example in which effects of the passivation pre-treatment were confirmed by using the material shown in the pre-treatment P01*. The material shown in the pre-treatment P01* is a darker sample than a general P01 treatment material that is obtained by performing bright annealing treatment in an Ar atmosphere at 800° C. for 20 seconds on a part to which much oil was adhered through cold-rolling to a thickness of 0.1 mm. Although both samples were subjected to the passivation treatment and the stabilization treatment, the contact conductivity was a little lower in a case in which the passivation pre-treatment was not performed (Invention Example: implement number [801]). Further, too high or too low current density for the passivation pre-treatment leads to insufficient effects and a little low contact conductivity (Invention Example: implement numbers [812] and [813]).

Table 9 to Table 11 also show example in which the passivation treatment and the stabilization treatment were performed after the passivation pre-treatment. Even in a case of using a substrate obtained by combining various kinds of substrates and pre-treatment, when the passivation pre-treatment was performed, stable and favorable contact conductivity was obtained.

Table 12 and Table 13 show other examples of the present invention and show favorable contact conductivity in each case.

Table 14 shows an example in which the post-treatment was performed on the test material according to the present invention. It is found that the contact conductivity was increased in each case.

It is found that, when any of the fraction of carbon whose nearest neighboring atom is double-bond O on the superficial layer and the fraction of carbon whose nearest neighboring atom is O of a hydroxyl group on the superficial layer, and the fraction of nitrogen whose nearest neighboring atom is H on the superficial layer are a certain value or more, the action of active oxygen in the oxide film on the surface of titanium or the titanium alloy is inhibited, which increases durability. On the other hand, when the fraction of carbon whose nearest neighboring atom is H of an alkyl group on the superficial layer is a certain value or more, the contact conductivity and durability are adversely affected. It is considered that this is because oil and the like adhered in the processes until the pre-treatment remains on the superficial layer, and the effects of the passivation treatment and the stabilization treatment are decreased. Accordingly, it is preferable that there is no alkyl group originating from contamination, such as remaining oil. Note that the alkyl group may be increased by the stabilization treatment. Currently, there is no method of analyzing the differences of origins of alkyl groups on the superficial layer; however, the increment of alkyl groups due to the stabilization treatment is limiting, and thus, as far as the regulated values described in the present invention are managed, certain performance can be satisfied.

Although a simple relation cannot be introduced because multiple factors are involved, in a case in which the fraction of calcium on the superficial layer is low, the increment of contact resistance tends to be increased after the accelerated deterioration test (Comparative Example: implement numbers [601] and [602]). It is found that, in a case of using an aqueous solution containing chromic acid for the passivation treatment, the fraction of chromium(III) on the superficial layer is increased.

As a reference, FIG. 1 shows a conceptual diagram showing a cross-sectional structure of a titanium or titanium alloy material for a fuel cell separator according to the present invention. Further, FIG. 2 shows an example of results of an investigation of a structure of a titanium material for a fuel cell separator having high contact conductivity with carbon and high durability according to the present invention, and (a) is a transmission electron microscope image showing a cut plane of the titanium material in the thickness direction, and (b) shows (i) results of substance identification analysis of conductive materials in the oxide film by an electron diffraction method, and (ii) results of energy dispersive X-ray spectroscopy.

It is found that fine TiN conductive materials are dispersed on the oxide film on the surface of the titanium substrate and has the structure shown in FIG. 1.

REFERENCE SIGNS LIST 1 substrate made of titanium for industrial use or titanium alloy
2 oxide film subjected to passivation treatment and stabilization treatment
3 conductive material

TABLE 1

|  |  | Implement Number | 101 | 102 | 103 | 104 | 105 |
|---|---|---|---|---|---|---|---|
|  |  | Abstract | Comparative | Comparative | Comparative | Comparative | Comparative |
| Material Treatment |  | Substrate | M01 | M01 | M01 | M01 | M01 |
|  |  | Pre-treatment | P01 | P01 | P01 | P01 | P01 |
|  |  | Passivation pre-treatment | — | — | — | — | — |
|  |  | Current density (A/m$^2$) | — | — | — | — | — |
|  |  | Treatment temperature (° C.) | — | — | — | — | — |
|  |  | Treatment time (minutes) | — | — | — | — | — |
|  |  | Passivation treatment | — | A01 | A01 | A01 | A01 |
|  |  | Treatment temperature (° C.) | — | 90 | 90 | 90 | 90 |
|  |  | Treatment time (minutes) | — | 1 | 5 | 10 | 15 |
|  |  | Stabilization Treatment | — | — | — | — | — |
|  |  | Treatment temperature (° C.) | — | — | — | — | — |
|  |  | Treatment time (minutes) | — | — | — | — | — |
|  |  | Post-treatment | — | — | — | — | — |
| Substance characteristics |  | Basic structure of oxide film (Y: comply, N: not comply) | N | N | N | N | N |
|  |  | Main conductive materials | TiC, TiN | TiC, TiN | TiC, TiN | TiC, TiN | TiC, TiN |
|  |  | Fraction of carbon whose nearest neighboring atom is double-bond O on surface (atomic %) | 5.0 | 1.6 | 1.0 | 0.8 | 1.2 |
|  |  | Fraction of carbon whose nearest neighboring atom is O of a hydroxyl group on surface (atomic %) | 3.0 | 0.9 | 0.3 | 0.5 | 0.0 |
|  |  | Fraction of carbon whose nearest neighboring atom is H of an alkyl group on surface (atomic %) | 62.0 | 42.3 | 43.3 | 40.5 | 35.0 |
|  |  | Fraction of nitrogen whose nearest neighboring atom is H on surface (atomic %) | 2.0 | 0.8 | 0.5 | 0.5 | 0.0 |
|  |  | Fraction of calcium on surface (atomic %) | 0.0 | 0.0 | 0.0 | 0.0 | 0.0 |
|  |  | Fraction of chromium(III) on surface (atomic %) | 0.0 | 0.0 | 0.0 | 0.0 | 0.0 |
| Contact conductivity (mΩ · cm$^2$) |  | Before accelerated deterioration test | 35 | 25 | 5 | 7 | 8 |
|  |  | After accelerated deterioration test | 268 | 212 | 148 | 99 | 52 |
|  |  | (Y: comply, N: not comply) | N | N | N | N | N |

TABLE 2

|  |  | Implement Number | 201 | 202 | 203 | 204 | 205 | 206 | 207 | 208 | 209 |
|---|---|---|---|---|---|---|---|---|---|---|---|
|  |  | Abstract | Invention | Invention | Invention | Invention | Invention | Invention | Invention | Invention | Invention |
| Material Treatment |  | Substrate | M01 | M01 | M01 | M01 | M01 | M01 | M01 | M01 | M01 |
|  |  | Pre-treatment | P01 | P01 | P01 | P01 | P01 | P01 | P01 | P01 | P01 |
|  |  | Passivation pre-treatment | — | — | — | — | — | — | — | — | — |
|  |  | Current density (A/m$^2$) | — | — | — | — | — | — | — | — | — |
|  |  | Treatment temperature (° C.) | — | — | — | — | — | — | — | — | — |
|  |  | Treatment time (minutes) | — | — | — | — | — | — | — | — | — |
|  |  | Passivation treatment | A01 | A01 | A01 | A01 | A01 | A01 | A01 | A01 | A01 |
|  |  | Treatment temperature (° C.) | 90 | 90 | 90 | 90 | 90 | 90 | 90 | 90 | 90 |
|  |  | Treatment time (minutes) | 0.5 | 1 | 2 | 3 | 5 | 7 | 10 | 15 | 20 |
|  |  | Stabilization Treatment | B01 | B01 | B01 | B01 | B01 | B01 | B01 | B01 | B01 |
|  |  | Treatment temperature (° C.) | 100 | 100 | 100 | 100 | 100 | 100 | 100 | 100 | 100 |

TABLE 2-continued

| | Implement Number | 201 | 202 | 203 | 204 | 205 | 206 | 207 | 208 | 209 |
|---|---|---|---|---|---|---|---|---|---|---|
| | Treatment time (minutes) | 5 | 5 | 5 | 5 | 5 | 5 | 5 | 5 | 5 |
| | Post-treatment | — | — | — | — | — | — | — | — | — |
| Substance characteristics | Basic structure of oxide film (Y: comply, N: not comply) | Y | Y | Y | Y | Y | Y | Y | Y | Y |
| | Main conductive materials | TiC, TiN | TiC, TiN | TiC, TiN | TiC, TiN | TiC, TiN | TiC, TiN | TiC, TiN | TiC, TiN | TiC, TiN |
| | Fraction of carbon whose nearest neighboring atom is double-bond O on surface (atomic %) | 3.0 | 5.2 | 4.8 | 5.1 | 5.2 | 4.8 | 6.7 | 3.8 | 2.4 |
| | Fraction of carbon whose nearest neighboring atom is O of a hydroxyl group on surface (atomic %) | 15.5 | 17.1 | 16.8 | 17.3 | 16.8 | 17.1 | 16.5 | 14.2 | 12.3 |
| | Fraction of carbon whose nearest neighboring atom is H of an alkyl group on surface (atomic %) | 25.3 | 22.3 | 24.5 | 24.4 | 23.3 | 22.4 | 23.5 | 22.3 | 25.2 |
| | Fraction of nitrogen whose nearest neighboring atom is H on surface (atomic %) | 1.5 | 2.9 | 2.7 | 3.1 | 3.2 | 3.1 | 3.3 | 3.2 | 2.5 |
| | Fraction of calcium on surface (atomic %) | 0.9 | 1.4 | 1.7 | 1.1 | 1.4 | 2.0 | 2.1 | 1.6 | 1.3 |
| | Fraction of chromium(III) on surface (atomic %) | 0.0 | 0.0 | 0.0 | 0.0 | 0.0 | 0.0 | 0.0 | 0.0 | 0.0 |
| Contact conductivity (mΩ·cm$^2$) | Before accelerated deterioration test | 19 | 18 | 16 | 15 | 12 | 13 | 12 | 15 | 18 |
| | After accelerated deterioration test | 20 | 19 | 19 | 15 | 15 | 13 | 13 | 16 | 19 |
| | (Y: comply, N: not comply) | Y | Y | Y | Y | Y | Y | Y | Y | Y |

TABLE 3

| | Implement Number | 301 | 302 | 303 | 304 | 305 | 306 | 307 | 308 | 309 |
|---|---|---|---|---|---|---|---|---|---|---|
| | Abstract | Comparative | Invention | Invention | Invention | Invention | Invention | Invention | Invention | Invention |
| Material Treatment | Substrate | M01 | M01 | M01 | M01 | M01 | M01 | M01 | M01 | M01 |
| | Pre-treatment | P01 | P01 | P01 | P01 | P01 | P01 | P01 | P01 | P01 |
| | Passivation pre-treatment | — | — | — | — | — | — | — | — | — |
| | Current density (A/m$^2$) | — | — | — | — | — | — | — | — | — |
| | Treatment temperature (° C.) | — | — | — | — | — | — | — | — | — |
| | Treatment time (minutes) | — | — | — | — | — | — | — | — | — |
| | Passivation treatment | A01 | A01 | A01 | A01 | A01 | A01 | A01 | A01 | A01 |
| | Treatment temperature (° C.) | 45 | 50 | 55 | 60 | 65 | 70 | 80 | 90 | 100 |
| | Treatment time (minutes) | 5 | 5 | 5 | 5 | 5 | 5 | 5 | 5 | 5 |
| | Stabilization Treatment | B01 | B01 | B01 | B01 | B01 | B01 | B01 | B01 | B01 |
| | Treatment temperature (° C.) | 100 | 100 | 100 | 100 | 100 | 100 | 100 | 100 | 100 |
| | Treatment time (minutes) | 5 | 5 | 5 | 5 | 5 | 5 | 5 | 5 | 5 |
| | Post-treatment | — | — | — | — | — | — | — | — | — |
| Substance characteristics | Basic structure of oxide film (Y: comply, N: not comply) | N | Y | Y | Y | Y | Y | Y | Y | Y |
| | Main conductive materials | TiC, TiN | TiC, TiN | TiC, TiN | TiC, TiN | TiC, TiN | TiC, TiN | TiC, TiN | TiC, TiN | TiC, TiN |
| | Fraction of carbon whose nearest neighboring atom is double-bond O on surface (atomic %) | 1.5 | 5.3 | 4.7 | 4.4 | 3.9 | 3.3 | 4.5 | 3.5 | 4.2 |
| | Fraction of carbon whose nearest neighboring atom is O of a hydroxyl group on surface (atomic %) | 8.5 | 18.2 | 19.1 | 18.8 | 19.1 | 19.1 | 19.2 | 19.4 | 19.8 |
| | Fraction of carbon whose nearest neighboring atom is H of an alkyl group on surface (atomic %) | 23.2 | 22.2 | 20.5 | 21.2 | 22.0 | 22.0 | 24.1 | 22.5 | 21.2 |
| | Fraction of nitrogen whose nearest neighboring atom is H on surface (atomic %) | 2.1 | 1.8 | 1.6 | 1.7 | 1.6 | 2.2 | 2.1 | 1.8 | 1.6 |
| | Fraction of calcium on surface (atomic %) | 0.8 | 1.6 | 1.7 | 1.6 | 1.4 | 1.9 | 1.5 | 1.6 | 1.7 |
| | Fraction of chromium(III) on surface (atomic %) | 0.0 | 0.0 | 0.0 | 0.0 | 0.0 | 0.0 | 0.0 | 0.0 | 0.0 |
| Contact conductivity (mΩ·cm$^2$) | Before accelerated deterioration test | 38 | 18 | 19 | 15 | 11 | 13 | 13 | 12 | 12 |
| | After accelerated deterioration test | 42 | 20 | 20 | 16 | 14 | 14 | 15 | 14 | 15 |
| | (Y: comply, N: not comply) | N | Y | Y | Y | Y | Y | Y | Y | Y |

TABLE 4

| | Implement Number | 401 | 402 | 403 | 404 | 405 | 406 | 407 |
|---|---|---|---|---|---|---|---|---|
| | Abstract | Invention | Invention | Invention | Invention | Invention | Invention | Invention |
| Material | Substrate | M01 | M01 | M01 | M01 | M01 | M01 | M01 |
| Treatment | Pre-treatment | P02 | P02 | P02 | P02 | P02 | P02 | P02 |
| | Passivation pre-treatment | — | — | — | — | — | — | — |
| | Current density (A/m$^2$) | — | — | — | — | — | — | — |
| | Treatment temperature (° C.) | — | — | — | — | — | — | — |
| | Treatment time (minutes) | — | — | — | — | — | — | — |
| | Passivation treatment | A01 | A02 | A03 | A04 | A05 | A06 | A07 |
| | Treatment temperature (° C.) | 90 | 90 | 90 | 90 | 90 | 90 | 90 |
| | Treatment time (minutes) | 5 | 5 | 5 | 5 | 5 | 5 | 5 |
| | Stabilization Treatment | B01 | B01 | B01 | B01 | B01 | B01 | B01 |
| | Treatment temperature (° C.) | 100 | 100 | 100 | 100 | 100 | 100 | 100 |
| | Treatment time (minutes) | 5 | 5 | 5 | 5 | 5 | 5 | 5 |
| | Post-treatment | — | — | — | — | — | — | — |
| Substance characteristics | Basic structure of oxide film (Y: comply, N: not comply) | Y | Y | Y | Y | Y | Y | Y |
| | Main conductive materials | TiN, TiC | TiN, TiC | TiN, TiC | TiN, TiC | TiN, TiC | TiN, TiC | TiN, TiC |
| | Fraction of carbon whose nearest neighboring atom is double-bond O on surface (atomic %) | 3.4 | 3.2 | 3.1 | 2.1 | 2.4 | 3.5 | 2.9 |
| | Fraction of carbon whose nearest neighboring atom is O of a hydroxyl group on surface (atomic %) | 14.2 | 11.1 | 15.5 | 14.7 | 13.2 | 16.1 | 16.2 |
| | Fraction of carbon whose nearest neighboring atom is H of an alkyl group on surface (atomic %) | 18.1 | 19.1 | 19.5 | 21.3 | 25.2 | 29.9 | 27.6 |
| | Fraction of nitrogen whose nearest neighboring atom is H on surface (atomic %) | 1.1 | 1.3 | 2.9 | 3.1 | 2.2 | 2.1 | 2.3 |
| | Fraction of calcium on surface (atomic %) | 1.1 | 1.4 | 2.1 | 1.3 | 1.2 | 1.6 | 1.8 |
| | Fraction of chromium(III) on surface (atomic %) | 0.0 | 0.0 | 0.0 | 0.0 | 3.2 | 2.1 | 2.5 |
| Contact conductivity (mΩ·cm$^2$) | Before accelerated deterioration test | 15 | 17 | 18 | 17 | 5 | 4 | 3 |
| | After accelerated deterioration test | 18 | 19 | 19 | 15 | 8 | 5 | 5 |
| | (Y: comply, N: not comply) | Y | Y | Y | Y | Y | Y | Y |

| | Implement Number | 408 | 409 | 410 | 411 | 412 |
|---|---|---|---|---|---|---|
| | Abstract | Invention | Invention | Invention | Invention | Invention |
| Material | Substrate | M01 | M01 | M01 | M01 | M01 |
| Treatment | Pre-treatment | P02 | P02 | P02 | P02 | P02 |
| | Passivation pre-treatment | — | — | — | — | — |
| | Current density (A/m$^2$) | — | — | — | — | — |
| | Treatment temperature (° C.) | — | — | — | — | — |
| | Treatment time (minutes) | — | — | — | — | — |
| | Passivation treatment | A08 | A09 | A10 | A11 | A12 |
| | Treatment temperature (° C.) | 90 | 90 | 90 | 90 | 90 |
| | Treatment time (minutes) | 5 | 5 | 5 | 5 | 5 |
| | Stabilization Treatment | B01 | B01 | B01 | B01 | B01 |
| | Treatment temperature (° C.) | 100 | 100 | 100 | 100 | 100 |
| | Treatment time (minutes) | 5 | 5 | 5 | 5 | 5 |
| | Post-treatment | — | — | — | — | — |
| Substance characteristics | Basic structure of oxide film (Y: comply, N: not comply) | Y | Y | Y | Y | Y |
| | Main conductive materials | TiN, TiC | TiN, TiC | TiN, TiC | TiN, TiC | TiN, TiC |
| | Fraction of carbon whose nearest neighboring atom is double-bond O on surface (atomic %) | 2.3 | 3.2 | 3.3 | 2.8 | 2.7 |
| | Fraction of carbon whose nearest neighboring atom is O of a hydroxyl group on surface (atomic %) | 17.2 | 18.2 | 19.1 | 20.1 | 18.7 |
| | Fraction of carbon whose nearest neighboring atom is H of an alkyl group on surface (atomic %) | 26.1 | 28.1 | 19.7 | 16.5 | 15.1 |
| | Fraction of nitrogen whose nearest neighboring atom is H on surface (atomic %) | 1.2 | 1.5 | 1.3 | 1.6 | 1.9 |
| | Fraction of calcium on surface (atomic %) | 1.7 | 1.5 | 2.2 | 2.4 | 1.7 |
| | Fraction of chromium(III) on surface (atomic %) | 1.5 | 1.8 | 1.9 | 1.2 | 1.1 |

TABLE 4-continued

|  |  |  |  |  |  |  |
|---|---|---|---|---|---|---|
| Contact conductivity (mΩ·cm$^2$) | Before accelerated deterioration test | 4 | 3 | 3 | 5 | 15 |
|  | After accelerated deterioration test | 5 | 4 | 5 | 7 | 17 |
|  | (Y: comply, N: not comply) | Y | Y | Y | Y | Y |

TABLE 5

|  | Implement Number | 501 | 502 | 503 | 504 | 505 | 506 | 507 | 508 | 509 |
|---|---|---|---|---|---|---|---|---|---|---|
|  | Abstract | Invention | Invention | Invention | Invention | Invention | Invention | Invention | Invention | Invention |
| Material Treatment | Substrate | M01 | M01 | M01 | M01 | M01 | M01 | M01 | M01 | M01 |
|  | Pre-treatment | P01 | P01 | P01 | P01 | P01 | P01 | P01 | P01 | P01 |
|  | Passivation pre-treatment | — | — | — | — | — | — | — | — | — |
|  | Current density (A/m$^2$) | — | — | — | — | — | — | — | — | — |
|  | Treatment temperature (° C.) | — | — | — | — | — | — | — | — | — |
|  | Treatment time (minutes) | — | — | — | — | — | — | — | — | — |
|  | Passivation treatment | A01 | A01 | A01 | A01 | A01 | A01 | A01 | A01 | A01 |
|  | Treatment temperature (° C.) | 90 | 90 | 90 | 90 | 90 | 90 | 90 | 90 | 90 |
|  | Treatment time (minutes) | 5 | 5 | 5 | 5 | 5 | 5 | 5 | 5 | 5 |
|  | Stabilization Treatment | B01 | B01 | B01 | B01 | B01 | B01 | B01 | B01 | B01 |
|  | Treatment temperature (° C.) | 100 | 100 | 100 | 100 | 100 | 100 | 100 | 100 | 100 |
|  | Treatment time (minutes) | 0.5 | 1 | 2 | 3 | 5 | 7 | 10 | 15 | 20 |
|  | Post-treatment | — | — | — | — | — | — | — | — | — |
| Substance characteristics | Basic structure of oxide film (Y: comply, N: not comply) | Y | Y | Y | Y | Y | Y | Y | Y | Y |
|  | Main conductive materials | TiC, TiN | TiC, TiN | TiC, TiN | TiC, TiN | TiC, TiN | TiC, TiN | TiC, TiN | TiC, TiN | TiC, TiN |
|  | Fraction of carbon whose nearest neighboring atom is double-bond O on surface (atomic %) | 2.1 | 5.3 | 6.2 | 6.6 | 5.5 | 6.8 | 7.3 | 6.9 | 7.7 |
|  | Fraction of carbon whose nearest neighboring atom is O of a hydroxyl group on surface (atomic %) | 8.9 | 18.2 | 18.5 | 19.3 | 21.1 | 22.2 | 23.1 | 22.1 | 14.9 |
|  | Fraction of carbon whose nearest neighboring atom is H of an alkyl group on surface (atomic %) | 38.9 | 29.8 | 28.8 | 25.5 | 22.3 | 18.8 | 21.1 | 23.5 | 27.3 |
|  | Fraction of nitrogen whose nearest neighboring atom is H on surface (atomic %) | 0.5 | 1.8 | 1.2 | 1.5 | 2.8 | 2.3 | 1.9 | 1.8 | 1.2 |
|  | Fraction of calcium on surface (atomic %) | 0.8 | 1.6 | 1.2 | 1.2 | 1.8 | 2.1 | 2.3 | 1.2 | 1.5 |
|  | Fraction of chromium(III) on surface (atomic %) | 0.0 | 0.0 | 0.0 | 0.0 | 0.0 | 0.0 | 0.0 | 0.0 | 0.0 |
| Contact conductivity (mΩ·cm$^2$) | Before accelerated deterioration test | 19 | 19 | 17 | 13 | 18 | 19 | 12 | 15 | 18 |
|  | After accelerated deterioration test | 20 | 19 | 19 | 15 | 18 | 17 | 13 | 16 | 19 |
|  | (Y: comply, N: not comply) | Y | Y | Y | Y | Y | Y | Y | Y | Y |

TABLE 6

|  | Implement Number | 601 | 602 | 603 | 604 | 605 | 606 | 607 | 608 |
|---|---|---|---|---|---|---|---|---|---|
|  | Abstract | Comparative | Comparative | Invention | Invention | Invention | Invention | Invention | Invention |
| Material Treatment | Substrate | M01 | M01 | M01 | M01 | M01 | M01 | M01 | M01 |
|  | Pre-treatment | P01 | P01 | P01 | P01 | P01 | P01 | P01 | P01 |
|  | Passivation pre-treatment | — | — | — | — | — | — | — | — |
|  | Current density (A/m$^2$) | — | — | — | — | — | — | — | — |
|  | Treatment temperature (° C.) | — | — | — | — | — | — | — | — |
|  | Treatment time (minutes) | — | — | — | — | — | — | — | — |
|  | Passivation treatment | A01 | A01 | A01 | A01 | A01 | A01 | A01 | A01 |
|  | Treatment temperature (° C.) | 90 | 90 | 90 | 90 | 90 | 90 | 90 | 90 |
|  | Treatment time (minutes) | 5 | 5 | 5 | 5 | 5 | 5 | 5 | 5 |
|  | Stabilization Treatment | B01 | B01 | B01 | B01 | B01 | B01 | B01 | B01 |
|  | Treatment temperature (° C.) | 40 | 50 | 60 | 70 | 75 | 80 | 85 | 100 |
|  | Treatment time (minutes) | 5 | 5 | 5 | 5 | 5 | 5 | 5 | 5 |
|  | Post-treatment | — | — | — | — | — | — | — | — |
| Substance characteristics | Basic structure of oxide film (Y: comply, N: not comply) | Y | Y | Y | Y | Y | Y | Y | Y |
|  | Main conductive materials | TiC, TiN | TiC, TiN | TiC, TiN | TiC, TiN | TiC, TiN | TiC, TiN | TiC, TiN | TiC, TiN |
|  | Fraction of carbon whose nearest neighboring atom is double-bond O on surface (atomic %) | 1.2 | 1.1 | 1.9 | 3.5 | 5.1 | 5.5 | 5.1 | 5.1 |

TABLE 6-continued

| | Implement Number | 601 | 602 | 603 | 604 | 605 | 606 | 607 | 608 |
|---|---|---|---|---|---|---|---|---|---|
| | Fraction of carbon whose nearest neighboring atom is O of a hydroxyl group on surface (atomic %) | 6.8 | 7.9 | 12.3 | 13.3 | 18.1 | 17.9 | 18.1 | 19.1 |
| | Fraction of carbon whose nearest neighboring atom is H of an alkyl group on surface (atomic %) | 43.2 | 45.3 | 29.9 | 24.4 | 23.2 | 26.2 | 24.2 | 22.5 |
| | Fraction of nitrogen whose nearest neighboring atom is H on surface (atomic %) | 0.5 | 0.8 | 1.2 | 1.2 | 2.8 | 1.8 | 2.8 | 2.8 |
| | Fraction of calcium on surface (atomic %) | 0.1 | 0.7 | 1.1 | 1.5 | 1.4 | 1.6 | 1.7 | 1.9 |
| | Fraction of chromium(III) on surface (atomic %) | 0.0 | 0.0 | 0.0 | 0.0 | 0.0 | 0.0 | 0.0 | 0.0 |
| Contact conductivity (mΩ·cm²) | Before accelerated deterioration test | 12 | 15 | 15 | 14 | 13 | 16 | 16 | 13 |
| | After accelerated deterioration test | 75 | 45 | 20 | 17 | 16 | 17 | 16 | 14 |
| | (Y: comply, N: not comply) | N | N | Y | Y | Y | Y | Y | Y |

TABLE 7

| | Implement Number | 701 | 702 | 703 | 704 | 705 | 706 | 707 |
|---|---|---|---|---|---|---|---|---|
| | Abstract | Invention | Invention | Invention | Invention | Invention | Invention | Invention |
| Material Treatment | Substrate | M01 | M01 | M01 | M01 | M01 | M01 | M01 |
| | Pre-treatment | P02 | P02 | P02 | P02 | P02 | P02 | P02 |
| | Passivation pre-treatment | — | — | — | — | — | — | — |
| | Current density (A/m²) | — | — | — | — | — | — | — |
| | Treatment temperature (° C.) | — | — | — | — | — | — | — |
| | Treatment time (minutes) | — | — | — | — | — | — | — |
| | Passivation treatment | A09 | A09 | A09 | A09 | A09 | A09 | A09 |
| | Treatment temperature (° C.) | 90 | 90 | 90 | 90 | 90 | 90 | 90 |
| | Treatment time (minutes) | 5 | 5 | 5 | 5 | 5 | 5 | 5 |
| | Stabilization Treatment | B01 | B02 | B03 | B04 | B05 | B06 | B07 |
| | Treatment temperature (° C.) | 100 | 100 | 100 | 100 | 100 | 100 | 100 |
| | Treatment time (minutes) | 5 | 5 | 5 | 5 | 5 | 5 | 5 |
| | Post-treatment | — | — | — | — | — | — | — |
| Substance characteristics | Basic structure of oxide film (Y: comply, N: not comply) | Y | Y | Y | Y | Y | Y | Y |
| | Main conductive materials | TiN | TiN | TiN | TiN | TiN | TiN | TiN |
| | Fraction of carbon whose nearest neighboring atom is double-bond O on surface (atomic %) | 3.7 | 2.1 | 1.5 | 1.6 | 2.1 | 3.1 | 4.2 |
| | Fraction of carbon whose nearest neighboring atom is O of a hydroxyl group on surface (atomic %) | 14.3 | 11.1 | 12.1 | 16.3 | 11.5 | 16.5 | 19.9 |
| | Fraction of carbon whose nearest neighboring atom is H of an alkyl group on surface (atomic %) | 16.7 | 18.2 | 12.1 | 21.1 | 16.8 | 17.2 | 25.2 |
| | Fraction of nitrogen whose nearest neighboring atom is H on surface (atomic %) | 2.4 | 1.1 | 1.2 | 1.5 | 2.1 | 1.3 | 3.1 |
| | Fraction of calcium on surface (atomic %) | 1.4 | 1.3 | 1.1 | 1.5 | 1.6 | 2.7 | 2.1 |
| | Fraction of chromium(III) on surface (atomic %) | 2.7 | 3.1 | 2.6 | 3.3 | 3.2 | 2.8 | 3.4 |
| Contact conductivity (mΩ·cm²) | Before accelerated deterioration test | 3 | 4 | 3 | 3 | 4 | 3 | 3 |
| | After accelerated deterioration test | 4 | 6 | 8 | 11 | 12 | 3 | 5 |
| | (Y: comply, N: not comply) | Y | Y | Y | Y | Y | Y | Y |

| | Implement Number | 708 | 709 | 710 | 711 | 712 | 713 |
|---|---|---|---|---|---|---|---|
| | Abstract | Invention | Invention | Invention | Invention | Invention | Invention |
| Material Treatment | Substrate | M01 | M01 | M01 | M01 | M01 | M01 |
| | Pre-treatment | P02 | P02 | P02 | P02 | P02 | P02 |
| | Passivation pre-treatment | — | — | — | — | — | — |
| | Current density (A/m²) | — | — | — | — | — | — |
| | Treatment temperature (° C.) | — | — | — | — | — | — |
| | Treatment time (minutes) | — | — | — | — | — | — |
| | Passivation treatment | A09 | A09 | A09 | A09 | A09 | A09 |
| | Treatment temperature (° C.) | 90 | 90 | 90 | 90 | 90 | 90 |
| | Treatment time (minutes) | 5 | 5 | 5 | 5 | 5 | 5 |
| | Stabilization Treatment | B08 | B09 | B10 | B11 | B12 | B13 |
| | Treatment temperature (° C.) | 100 | 100 | 100 | 100 | 100 | 100 |
| | Treatment time (minutes) | 5 | 5 | 5 | 5 | 5 | 5 |
| | Post-treatment | — | — | — | — | — | — |

TABLE 7-continued

| | | | | | | | |
|---|---|---|---|---|---|---|---|
| Substance characteristics | Basic structure of oxide film (Y: comply, N: not comply) | Y | Y | Y | Y | Y | Y |
| | Main conductive materials | TiN | TiN | TiN | TiN | TiN | TiN |
| | Fraction of carbon whose nearest neighboring atom is double-bond O on surface (atomic %) | 3.5 | 3.8 | 3.8 | 4.1 | 3.9 | 3.5 |
| | Fraction of carbon whose nearest neighboring atom is O of a hydroxyl group on surface (atomic %) | 21.2 | 16.7 | 14.4 | 21.1 | 23.2 | 15.1 |
| | Fraction of carbon whose nearest neighboring atom is H of an alkyl group on surface (atomic %) | 29.8 | 26.4 | 17.6 | 22.5 | 26.2 | 17.1 |
| | Fraction of nitrogen whose nearest neighboring atom is H on surface (atomic %) | 3.2 | 2.5 | 2.6 | 2.1 | 3.1 | 2.4 |
| | Fraction of calcium on surface (atomic %) | 1.8 | 1.9 | 1.3 | 1.2 | 1.8 | 1.3 |
| | Fraction of chromium(III) on surface (atomic %) | 2.6 | 2.4 | 2.1 | 2.3 | 2.2 | 1.9 |
| Contact conductivity ($m\Omega \cdot cm^2$) | Before accelerated deterioration test | 4 | 4 | 4 | 3 | 3 | 3 |
| | After accelerated deterioration test | 5 | 5 | 3 | 4 | 5 | 4 |
| | (Y: comply, N: not comply) | Y | Y | Y | Y | Y | Y |

TABLE 8

| | | | | | | | | |
|---|---|---|---|---|---|---|---|---|
| | Implement Number | 801 | 802 | 803 | 804 | 805 | 806 | 807 |
| Material Treatment | Abstract | Invention | Invention | Invention | Invention | Invention | Invention | Invention |
| | Substrate | M01 | M01 | M01 | M01 | M01 | M01 | M01 |
| | Pre-treatment | P01* | P01* | P01* | P01* | P01* | P01* | P01* |
| | Passivation pre-treatment | — | F01 | F02 | F03 | F04 | F05 | F06 |
| | Current density ($A/m^2$) | — | 5 | 5 | 3 | 1 | 2 | 3 |
| | Treatment temperature (° C.) | — | 70 | 60 | 50 | 50 | 50 | 30 |
| | Treatment time (minutes) | — | 25 | 25 | 35 | 25 | 20 | 30 |
| | Passivation treatment | A09 | A09 | A09 | A09 | A09 | A09 | A09 |
| | Treatment temperature (° C.) | 100 | 100 | 100 | 100 | 100 | 100 | 100 |
| | Treatment time (minutes) | 5 | 5 | 5 | 5 | 5 | 5 | 5 |
| | Stabilization Treatment | B11 | B11 | B11 | B11 | B11 | B11 | B11 |
| | Treatment temperature (° C.) | 100 | 100 | 100 | 100 | 100 | 100 | 100 |
| | Treatment time (minutes) | 5 | 5 | 5 | 5 | 5 | 5 | 5 |
| | Post-treatment | — | — | — | — | — | — | — |
| Substance characteristics | Basic structure of oxide film (Y: comply, N: not comply) | Y | Y | Y | Y | Y | Y | Y |
| | Main conductive materials | TiC, TiN | TiC, TiN | TiC, TiN | TiC, TiN | TiC, TiN | TiC, TiN | TiC, TiN |
| | Fraction of carbon whose nearest neighboring atom is double-bond O on surface (atomic %) | 2.2 | 3.7 | 3.4 | 4.2 | 3.2 | 4.4 | 3.6 |
| | Fraction of carbon whose nearest neighboring atom is O of a hydroxyl group on surface (atomic %) | 5.2 | 14.3 | 14.2 | 26.7 | 11.1 | 12.3 | 14.2 |
| | Fraction of carbon whose nearest neighboring atom is H of an alkyl group on surface (atomic %) | 35.2 | 16.7 | 16.6 | 18.0 | 28.5 | 24.4 | 21.1 |
| | Fraction of nitrogen whose nearest neighboring atom is H on surface (atomic %) | 1.3 | 2.4 | 2.2 | 1.2 | 1.4 | 2.2 | 1.1 |
| | Fraction of calcium on surface (atomic %) | 0.9 | 1.4 | 1.1 | 1.4 | 1.2 | 1.6 | 1.8 |
| | Fraction of chromium(III) on surface (atomic %) | 3.5 | 2.7 | 1.1 | 3.1 | 3.3 | 3.2 | 3.1 |
| Contact conductivity ($m\Omega \cdot cm^2$) | Before accelerated deterioration test | 15 | 3 | 3 | 4 | 5 | 4 | 5 |
| | After accelerated deterioration test | 19 | 4 | 3 | 4 | 3 | 3 | 3 |
| | (Y: comply, N: not comply) | Y | Y | Y | Y | Y | Y | Y |
| | Implement Number | 808 | 809 | 810 | 811 | 812 | 813 | |
| Material Treatment | Abstract | Invention | Invention | Invention | Invention | Invention | Invention | |
| | Substrate | M01 | M01 | M01 | M01 | M01 | M01 | |
| | Pre-treatment | P01* | P01* | P01* | P01* | P01* | P01* | |
| | Passivation pre-treatment | F07 | F08 | F09 | F10 | F01 | F01 | |
| | Current density ($A/m^2$) | 5 | 5 | 7 | 10 | 0.5 | 25 | |
| | Treatment temperature (° C.) | 40 | 50 | 50 | 50 | 50 | 50 | |
| | Treatment time (minutes) | 20 | 5 | 10 | 2 | 30 | 5 | |
| | Passivation treatment | A09 | A09 | A09 | A09 | A09 | A09 | |
| | Treatment temperature (° C.) | 100 | 100 | 100 | 100 | 100 | 100 | |
| | Treatment time (minutes) | 5 | 5 | 5 | 5 | 5 | 5 | |
| | Stabilization Treatment | B11 | B11 | B11 | B11 | B11 | B11 | |

TABLE 8-continued

|  |  |  |  |  |  |  |  |
|---|---|---|---|---|---|---|---|
|  | Treatment temperature (° C.) | 100 | 100 | 100 | 100 | 100 | 100 |
|  | Treatment time (minutes) | 5 | 5 | 5 | 5 | 5 | 5 |
|  | Post-treatment | — | — | — | — | — | — |
| Substance characteristics | Basic structure of oxide film (Y: comply, N: not comply) | Y | Y | Y | Y | Y | Y |
|  | Main conductive materials | TiC, TiN | TiC, TiN | TiC, TiN | TiC, TiN | TiC, TiN | TiC, TiN |
|  | Fraction of carbon whose nearest neighboring atom is double-bond O on surface (atomic %) | 3.2 | 3.9 | 3.7 | 2.1 | 2.1 | 2.3 |
|  | Fraction of carbon whose nearest neighboring atom is O of a hydroxyl group on surface (atomic %) | 17.8 | 14.2 | 18.7 | 21.1 | 2.3 | 4.8 |
|  | Fraction of carbon whose nearest neighboring atom is H of an alkyl group on surface (atomic %) | 23.3 | 16.7 | 16.7 | 19.2 | 38.6 | 33.2 |
|  | Fraction of nitrogen whose nearest neighboring atom is H on surface (atomic %) | 2.2 | 2.5 | 2.2 | 1.8 | 1.1 | 1.3 |
|  | Fraction of calcium on surface (atomic %) | 1.3 | 1.5 | 2.0 | 1.2 | 0.8 | 0.9 |
|  | Fraction of chromium(III) on surface (atomic %) | 2.8 | 1.8 | 1.2 | 1.5 | 0.1 | 2.2 |
| Contact conductivity (mΩ · cm$^2$) | Before accelerated deterioration test | 4 | 3 | 3 | 3 | 13 | 16 |
|  | After accelerated deterioration test | 3 | 3 | 4 | 3 | 18 | 19 |
|  | (Y: comply, N: not comply) | Y | Y | Y | Y | Y | Y |

TABLE 9

|  |  | 901 | 902 | 903 | 904 | 905 | 906 | 907 | 908 | 909 | 910 |
|---|---|---|---|---|---|---|---|---|---|---|---|
|  | Implement Number |  |  |  |  |  |  |  |  |  |  |
|  | Abstract | Invention | Invention | Invention | Invention | Invention | Invention | Invention | Invention | Invention | Invention |
| Material Treatment | Substrate | M05 | M05 | M05 | M05 | M05 | M05 | M05 | M05 | M05 | M05 |
|  | Pre-treatment | P01* | P01* | P01* | P01* | P01* | P01* | P01* | P01* | P01* | P01* |
|  | Passivation pre-treatment | D01 | D02 | D03 | D04 | D05 | D06 | D03 | D03 | D03 | D03 |
|  | Current density (A/m$^2$) | 10 | 10 | 10 | 10 | 10 | 10 | 20 | 5 | 3 | 1 |
|  | Treatment temperature (° C.) | 50 | 50 | 50 | 50 | 50 | 50 | 50 | 50 | 50 | 50 |
|  | Treatment time (minutes) | 5 | 5 | 5 | 5 | 5 | 5 | 3 | 15 | 20 | 30 |
|  | Passivation treatment | A01 | A01 | A01 | A01 | A01 | A01 | A01 | A01 | A01 | A01 |
|  | Treatment temperature (° C.) | 90 | 90 | 90 | 90 | 90 | 90 | 90 | 90 | 90 | 90 |
|  | Treatment time (minutes) | 5 | 5 | 5 | 5 | 5 | 5 | 5 | 5 | 5 | 5 |
|  | Stabilization Treatment | B11 | B11 | B11 | B11 | B11 | B11 | B11 | B11 | B11 | B11 |
|  | Treatment temperature (° C.) | 100 | 100 | 100 | 100 | 100 | 100 | 100 | 100 | 100 | 100 |
|  | Treatment time (minutes) | 5 | 5 | 5 | 5 | 5 | 5 | 5 | 5 | 5 | 5 |
|  | Post-treatment | — | — | — | — | — | — | — | — | — | — |
| Substance characteristics | Basic structure of oxide film (Y: comply, N: not comply) | Y | Y | Y | Y | Y | Y | Y | Y | Y | Y |
|  | Main conductive materials | TiC, TiN | TiC, TiN | TiC, TiN | TiC, TiN | TiC, TiN | TiC, TiN | TiC, TiN | TiC, TiN | TiC, TiN | TiC, TiN |
|  | Fraction of carbon whose nearest neighboring atom is double-bond O on surface (atomic %) | 3.6 | 2.1 | 3.1 | 3.5 | 3.2 | 3.7 | 4.1 | 2.1 | 2.5 | 3.1 |
|  | Fraction of carbon whose nearest neighboring atom is O of a hydroxyl group on surface (atomic %) | 14.5 | 10.5 | 15.1 | 14.6 | 17.1 | 16.2 | 18.1 | 12.1 | 11.1 | 15.2 |
|  | Fraction of carbon whose nearest neighboring atom is H of an alkyl group on surface (atomic %) | 17.1 | 16.5 | 18.1 | 19.1 | 22.1 | 18.2 | 16.5 | 15.4 | 13.2 | 18.9 |
|  | Fraction of nitrogen whose nearest neighboring atom is H on surface (atomic %) | 2.5 | 2.5 | 2.2 | 2.4 | 3.1 | 1.2 | 1.4 | 1.5 | 2.1 | 2.1 |
|  | Fraction of calcium on surface (atomic %) | 1.3 | 1.1 | 1.9 | 1.8 | 1.3 | 1.4 | 1.7 | 1.2 | 1.5 | 1.9 |
|  | Fraction of chromium(III) on surface (atomic %) | 0.0 | 0.0 | 0.0 | 0.0 | 0.0 | 0.0 | 0.0 | 0.0 | 0.0 | 0.0 |
| Contact conductivity (mΩ · cm$^2$) | Before accelerated deterioration test | 3 | 3 | 4 | 5 | 4 | 5 | 4 | 3 | 3 | 3 |
|  | After accelerated deterioration test | 4 | 3 | 4 | 3 | 3 | 3 | 3 | 3 | 4 | 3 |
|  | (Y: comply, N: not comply) | Y | Y | Y | Y | Y | Y | Y | Y | Y | Y |

TABLE 10

| | Implement Number | a01 | a02 | a03 | a04 | a05 | a06 | a07 | a08 | a09 |
|---|---|---|---|---|---|---|---|---|---|---|
| | Abstract | Invention | Invention | Invention | Invention | Invention | Invention | Invention | Invention | Invention |
| Material | Substrate | M01 | M01 | M01 | M01 | M01 | M01 | M01 | M01 | M01 |
| Treatment | Pre-treatment | P02 | P03 | P04 | P05 | P06 | P07 | P08 | P09 | P10 |
| | Passivation pre-treatment | D03 | D03 | D03 | D03 | D03 | D03 | D03 | D03 | D03 |
| | Current density (A/m$^2$) | 10 | 10 | 10 | 10 | 10 | 10 | 10 | 10 | 10 |
| | Treatment temperature (° C.) | 50 | 50 | 50 | 50 | 50 | 50 | 50 | 50 | 50 |
| | Treatment time (minutes) | 5 | 5 | 5 | 5 | 5 | 5 | 5 | 5 | 5 |
| | Passivation treatment | A09 | A09 | A09 | A09 | A09 | A09 | A09 | A09 | A09 |
| | Treatment temperature (° C.) | 100 | 100 | 100 | 100 | 100 | 100 | 100 | 100 | 100 |
| | Treatment time (minutes) | 5 | 5 | 5 | 5 | 5 | 5 | 5 | 5 | 5 |
| | Stabilization Treatment | B11 | B11 | B11 | B11 | B11 | B11 | B11 | B11 | B11 |
| | Treatment temperature (° C.) | 100 | 100 | 100 | 100 | 100 | 100 | 100 | 100 | 100 |
| | Treatment time (minutes) | 5 | 5 | 5 | 5 | 5 | 5 | 5 | 5 | 5 |
| | Post-treatment | — | — | — | — | — | — | — | — | — |
| Substance characteristics | Basic structure of oxide film (Y: comply, N: not comply) | Y | Y | Y | Y | Y | Y | Y | Y | Y |
| | Main conductive materials | TiN, TiC | TiC | TiN | TiN | TaC | TaN | TaCN | CrB | ZrB |
| | Fraction of carbon whose nearest neighboring atom is double-bond O on surface (atomic %) | 3.6 | 3.4 | 3.3 | 3.2 | 2.3 | 2.1 | 2.5 | 4.5 | 3.4 |
| | Fraction of carbon whose nearest neighboring atom is O of a hydroxyl group on surface (atomic %) | 14.2 | 14.2 | 14.3 | 15.1 | 14.2 | 13.1 | 10.5 | 16.1 | 12.2 |
| | Fraction of carbon whose nearest neighboring atom is H of an alkyl group on surface (atomic %) | 17.6 | 18.1 | 12.1 | 15.5 | 21.1 | 23.2 | 25.1 | 17.8 | 16.7 |
| | Fraction of nitrogen whose nearest neighboring atom is H on surface (atomic %) | 2.3 | 1.1 | 1.5 | 2.1 | 2.3 | 2.5 | 2.3 | 3.1 | 2.1 |
| | Fraction of calcium on surface (atomic %) | 1.2 | 1.1 | 1.4 | 1.5 | 1.9 | 1.9 | 2.1 | 2.2 | 1.3 |
| | Fraction of chromium(III) on surface (atomic %) | 2.8 | 2.6 | 3.1 | 2.1 | 2.3 | 1.9 | 1.3 | 2.3 | 2.4 |
| Contact conductivity (mΩ · cm$^2$) | Before accelerated deterioration test | 3 | 3 | 3 | 3 | 3 | 3 | 4 | 3 | 3 |
| | After accelerated deterioration test | 3 | 3 | 3 | 3 | 3 | 3 | 4 | 3 | 3 |
| | (Y: comply, N: not comply) | Y | Y | Y | Y | Y | Y | Y | Y | Y |

TABLE 11

| | Implement Number | b01 | b02 | b03 | b04 | b05 | b06 | b07 | b08 | b09 | b10 |
|---|---|---|---|---|---|---|---|---|---|---|---|
| | Abstract | Invention | Invention | Invention | Invention | Invention | Invention | Invention | Invention | Invention | Invention |
| Material | Substrate | M05 | M06 | M05 | M06 | M05 | M06 | M05 | M06 | M05 | M06 |
| Treatment | Pre-treatment | P01* | P01* | P02 | P02 | P03 | P03 | P04 | P04 | P05 | P05 |
| | Passivation pre-treatment | D03 | D03 | D03 | D03 | D03 | D03 | D03 | D03 | D03 | D03 |
| | Current density (A/m$^2$) | 10 | 10 | 10 | 10 | 10 | 10 | 10 | 10 | 10 | 10 |
| | Treatment temperature (° C.) | 50 | 50 | 50 | 50 | 50 | 50 | 50 | 50 | 50 | 50 |
| | Treatment time (minutes) | 5 | 5 | 5 | 5 | 5 | 5 | 5 | 5 | 5 | 5 |
| | Passivation treatment | A09 | A09 | A09 | A09 | A09 | A09 | A09 | A09 | A09 | A09 |
| | Treatment temperature (° C.) | 100 | 100 | 100 | 100 | 100 | 100 | 100 | 100 | 100 | 100 |
| | Treatment time (minutes) | 5 | 5 | 5 | 5 | 5 | 5 | 5 | 5 | 5 | 5 |
| | Stabilization Treatment | B11 | B11 | B11 | B11 | B11 | B11 | B11 | B11 | B11 | B11 |
| | Treatment temperature (° C.) | 100 | 100 | 100 | 100 | 100 | 100 | 100 | 100 | 100 | 100 |
| | Treatment time (minutes) | 5 | 5 | 5 | 5 | 5 | 5 | 5 | 5 | 5 | 5 |
| | Post-treatment | — | — | — | — | — | — | — | — | — | — |
| Substance characteristics | Basic structure of oxide film (Y: comply, N: not comply) | Y | Y | Y | Y | Y | Y | Y | Y | Y | Y |
| | Main conductive materials | TiC, TiN | TiC, TaC | TiN, VC | TaN, TiN | TiC, VC | TiC, TaC | TiN, VC | TiN, TaN | TiCN, VN | TiCN, TaN |
| | Fraction of carbon whose nearest neighboring atom is double-bond O on surface (atomic %) | 3.4 | 3.2 | 3.5 | 3.3 | 2.1 | 1.5 | 1.8 | 3.1 | 3.2 | 3.2 |
| | Fraction of carbon whose nearest neighboring atom is O of a hydroxyl group on surface (atomic %) | 14.2 | 15.2 | 16.6 | 17.7 | 21.1 | 24.2 | 21.1 | 13.2 | 14.6 | 14.2 |
| | Fraction of carbon whose nearest neighboring atom is H of an alkyl group on surface (atomic %) | 18.1 | 19.2 | 17.3 | 21.1 | 22.1 | 15.1 | 18.3 | 17.2 | 16.8 | 15.1 |
| | Fraction of nitrogen whose nearest neighboring atom is H on surface (atomic %) | 1.1 | 1.3 | 1.5 | 1.7 | 1.3 | 1.9 | 2.1 | 1.2 | 1.5 | 2.3 |
| | Fraction of calcium on surface (atomic %) | 1.1 | 1.5 | 1.1 | 1.3 | 1.2 | 1.4 | 1.3 | 1.4 | 1.3 | 1.1 |

TABLE 11-continued

| | Implement Number | b01 | b02 | b03 | b04 | b05 | b06 | b07 | b08 | b09 | b10 |
|---|---|---|---|---|---|---|---|---|---|---|---|
| | Fraction of chromium(III) on surface (atomic %) | 2.6 | 2.4 | 2.5 | 3.2 | 2.3 | 2.5 | 1.1 | 2.3 | 3.1 | 3.3 |
| Contact conductivity ($m\Omega \cdot cm^2$) | Before accelerated deterioration test | 4 | 3 | 4 | 3 | 4 | 3 | 3 | 3 | 3 | 3 |
| | After accelerated deterioration test | 4 | 3 | 4 | 3 | 4 | 3 | 4 | 3 | 4 | 4 |
| | (Y: comply, N: not comply) | Y | Y | Y | Y | Y | Y | Y | Y | Y | Y |

TABLE 12

| | Implement Number | c01 | c02 | c03 | c04 | c05 | c06 | c07 |
|---|---|---|---|---|---|---|---|---|
| Material Treatment | Abstract | Invention | Invention | Invention | Invention | Invention | Invention | Invention |
| | Substrate | M01 | M02 | M03 | M04 | M01 | M02 | M03 |
| | Pre-treatment | P01 | P01 | P01 | P01 | P01 | P01 | P01 |
| | Passivation pre-treatment | — | — | — | — | — | — | — |
| | Current density (A/m$^2$) | — | — | — | — | — | — | — |
| | Treatment temperature (° C.) | — | — | — | — | — | — | — |
| | Treatment time (minutes) | — | — | — | — | — | — | — |
| | Passivation treatment | A06 | A07 | A08 | A09 | A10 | A11 | A12 |
| | Treatment temperature (° C.) | 100 | 110 | 80 | 90 | 90 | 90 | 90 |
| | Treatment time (minutes) | 3 | 5 | 10 | 5 | 5 | 5 | 5 |
| | Stabilization Treatment | B07 | B01 | B08 | B09 | B10 | B11 | B12 |
| | Treatment temperature (° C.) | 100 | 100 | 100 | 100 | 100 | 100 | 100 |
| | Treatment time (minutes) | 5 | 5 | 5 | 5 | 5 | 5 | 5 |
| | Post-treatment | — | — | — | — | — | — | — |
| Substance characteristics | Basic structure of oxide film (Y: comply, N: not comply) | Y | Y | Y | Y | Y | Y | Y |
| | Main conductive materials | TiC, TiN | TiC, TiN | TiC, TiN | TiC, TiN | TiC, TiN | TiC, TiN | TiC, TiN |
| | Fraction of carbon whose nearest neighboring atom is double-bond O on surface (atomic %) | 3.6 | 3.2 | 3.3 | 2.2 | 2.3 | 3.5 | 4.1 |
| | Fraction of carbon whose nearest neighboring atom is O of a hydroxyl group on surface (atomic %) | 13.4 | 13.2 | 13.2 | 14.2 | 13.3 | 12.1 | 11.9 |
| | Fraction of carbon whose nearest neighboring atom is H of an alkyl group on surface (atomic %) | 17.8 | 18.8 | 19.1 | 18.9 | 19.3 | 19.5 | 16.7 |
| | Fraction of nitrogen whose nearest neighboring atom is H on surface (atomic %) | 2.2 | 2.1 | 1.9 | 1.8 | 1.6 | 2.5 | 2.4 |
| | Fraction of calcium on surface (atomic %) | 1.3 | 1.2 | 2.3 | 1.7 | 1.8 | 2.7 | 1.6 |
| | Fraction of chromium(III) on surface (atomic %) | 2.8 | 2.9 | 2.1 | 1.9 | 1.5 | 2.1 | 1.1 |
| Contact conductivity ($m\Omega \cdot cm^2$) | Before accelerated deterioration test | 4 | 3 | 3 | 3 | 4 | 3 | 3 |
| | After accelerated deterioration test | 4 | 6 | 8 | 8 | 6 | 5 | 4 |
| | (Y: comply, N: not comply) | Y | Y | Y | Y | Y | Y | Y |

| | Implement Number | c08 | c09 | c10 | c11 | c12 | c13 |
|---|---|---|---|---|---|---|---|
| Material Treatment | Abstract | Invention | Invention | Invention | Invention | Invention | invention |
| | Substrate | M04 | M01 | M02 | M03 | M04 | M01 |
| | Pre-treatment | P03 | P04 | P05 | P06 | P07 | P08 |
| | Passivation pre-treatment | D03 | D03 | D03 | D03 | D03 | D03 |
| | Current density (A/m$^2$) | 10 | 10 | 10 | 10 | 10 | 10 |
| | Treatment temperature (° C.) | 50 | 50 | 50 | 50 | 50 | 50 |
| | Treatment time (minutes) | 5 | 5 | 5 | 5 | 5 | 5 |
| | Passivation treatment | A09 | A09 | A09 | A09 | A09 | A09 |
| | Treatment temperature (° C.) | 90 | 90 | 90 | 90 | 90 | 90 |
| | Treatment time (minutes) | 5 | 5 | 5 | 5 | 5 | 5 |
| | Stabilization Treatment | B13 | B09 | B10 | B11 | B12 | B13 |
| | Treatment temperature (° C.) | 100 | 100 | 100 | 100 | 100 | 100 |
| | Treatment time (minutes) | 5 | 5 | 5 | 5 | 5 | 5 |
| | Post-treatment | — | — | — | — | — | — |
| Substance characteristics | Basic structure of oxide film (Y: comply, N: not comply) | Y | Y | Y | Y | Y | Y |
| | Main conductive materials | TiC | TiN | TiCN | TaC | TaN | TaCN |
| | Fraction of carbon whose nearest neighboring atom is double-bond O on surface (atomic %) | 3.5 | 3.9 | 3.1 | 3.2 | 2.8 | 2.9 |
| | Fraction of carbon whose nearest neighboring atom is O of a hydroxyl group on surface (atomic %) | 10.5 | 14.5 | 15.8 | 17.9 | 19.1 | 15.6 |
| | Fraction of carbon whose nearest neighboring atom is H of an alkyl group on surface (atomic %) | 15.4 | 13.2 | 15.9 | 19.8 | 18.4 | 15.6 |

TABLE 12-continued

|  |  |  |  |  |  |  |  |
|---|---|---|---|---|---|---|---|
| | Fraction of nitrogen whose nearest neighboring atom is H on surface (atomic %) | 3.1 | 2.6 | 3.3 | 3.5 | 4.5 | 2.4 |
| | Fraction of calcium on surface (atomic %) | 1.7 | 1.2 | 1.1 | 1.3 | 1.5 | 1.4 |
| | Fraction of chromium(III) on surface (atomic %) | 1.3 | 1.5 | 1.7 | 1.8 | 1.4 | 1.3 |
| Contact conductivity (mΩ · cm$^2$) | Before accelerated deterioration test | 4 | 3 | 3 | 3 | 3 | 3 |
| | After accelerated deterioration test | 4 | 4 | 4 | 4 | 3 | 4 |
| | (Y: comply, N: not comply) | Y | Y | Y | Y | Y | Y |

TABLE 13

| | Implement Number | d01 | d02 | d03 | d04 | d05 | d06 | d07 |
|---|---|---|---|---|---|---|---|---|
| Material Treatment | Abstract | Invention | Invention | Invention | Invention | Invention | Invention | Invention |
| | Substrate | M01 | M01 | M02 | M03 | M04 | M01 | M02 |
| | Pre-treatment | P02 | P02 | P02 | P02 | P02 | P02 | P02 |
| | Passivation pre-treatment | — | — | — | — | — | — | — |
| | Current density (A/m$^2$) | — | — | — | — | — | — | — |
| | Treatment temperature (° C.) | — | — | — | — | — | — | — |
| | Treatment time (minutes) | — | — | — | — | — | — | — |
| | Passivation treatment | A06 | A07 | A08 | A09 | A10 | A11 | A12 |
| | Treatment temperature (° C.) | 100 | 110 | 80 | 90 | 90 | 90 | 90 |
| | Treatment time (minutes) | 3 | 5 | 10 | 5 | 5 | 5 | 5 |
| | Stabilization Treatment | B07 | B01 | B08 | B09 | B10 | B11 | B12 |
| | Treatment temperature (° C.) | 100 | 100 | 100 | 100 | 100 | 100 | 100 |
| | Treatment time (minutes) | 5 | 5 | 5 | 5 | 5 | 5 | 5 |
| | Post-treatment | — | — | — | — | — | — | — |
| Substance characteristics | Basic structure of oxide film (Y: comply, N: not comply) | Y | Y | Y | Y | Y | Y | Y |
| | Main conductive materials | TiN | TiN | TiN | TiN | TiN | TiN | TiN |
| | Fraction of carbon whose nearest neighboring atom is double-bond O on surface (atomic %) | 3.2 | 3.3 | 3.5 | 2.9 | 2.5 | 3.6 | 3.1 |
| | Fraction of carbon whose nearest neighboring atom is O of a hydroxyl group on surface (atomic %) | 13.4 | 13.5 | 10.5 | 11.2 | 13.5 | 15.6 | 19.8 |
| | Fraction of carbon whose nearest neighboring atom is H of an alkyl group on surface (atomic %) | 16.6 | 21.1 | 24.2 | 19.8 | 18.7 | 15.4 | 13.2 |
| | Fraction of nitrogen whose nearest neighboring atom is H on surface (atomic %) | 2.2 | 2.3 | 2.6 | 1.9 | 2.7 | 2.9 | 3.1 |
| | Fraction of calcium on surface (atomic %) | 1.3 | 1.5 | 2.1 | 2.4 | 1.8 | 1.9 | 1.7 |
| | Fraction of chromium(III) on surface (atomic %) | 2.8 | 2.1 | 2.5 | 1.9 | 2.4 | 2.3 | 1.7 |
| Contact conductivity (mΩ · cm$^2$) | Before accelerated deterioration test | 3 | 3 | 3 | 4 | 3 | 3 | 4 |
| | After accelerated deterioration test | 8 | 9 | 8 | 8 | 7 | 6 | 7 |
| | (Y: comply, N: not comply) | Y | Y | Y | Y | Y | Y | Y |

| | Implement Number | d08 | d09 | d10 | d11 | d12 | d13 |
|---|---|---|---|---|---|---|---|
| Material Treatment | Abstract | Invention | Invention | Invention | Invention | Invention | Invention |
| | Substrate | M03 | M04 | M01 | M02 | M03 | M04 |
| | Pre-treatment | P02 | P02 | P02 | P02 | P02 | P02 |
| | Passivation pre-treatment | D03 | D03 | D03 | D03 | D03 | D03 |
| | Current density (A/m$^2$) | 1 | 2 | 3 | 5 | 7 | 20 |
| | Treatment temperature (° C.) | 50 | 50 | 50 | 50 | 50 | 50 |
| | Treatment time (minutes) | 5 | 5 | 5 | 5 | 5 | 5 |
| | Passivation treatment | A09 | A09 | A09 | A09 | A09 | A09 |
| | Treatment temperature (° C.) | 90 | 90 | 90 | 90 | 90 | 90 |
| | Treatment time (minutes) | 5 | 5 | 5 | 5 | 5 | 5 |
| | Stabilization Treatment | B10 | B10 | B10 | B10 | B10 | B10 |
| | Treatment temperature (° C.) | 90 | 85 | 90 | 95 | 70 | 80 |
| | Treatment time (minutes) | 5 | 5 | 5 | 5 | 5 | 5 |
| | Post-treatment | — | — | — | — | — | — |
| Substance characteristics | Basic structure of oxide film (Y: comply, N: not comply) | Y | Y | Y | Y | Y | Y |
| | Main conductive materials | TiN | TiN | TiN | TiN | TiN | TiN |
| | Fraction of carbon whose nearest neighboring atom is double-bond O on surface (atomic %) | 2.6 | 3.2 | 3.4 | 2.4 | 2.1 | 2.2 |
| | Fraction of carbon whose nearest neighboring atom is O of a hydroxyl group on surface (atomic %) | 18.7 | 17.6 | 19.8 | 13.4 | 12.1 | 15.1 |

TABLE 13-continued

|  |  |  |  |  |  |  |  |
|---|---|---|---|---|---|---|---|
|  | Fraction of carbon whose nearest neighboring atom is H of an alkyl group on surface (atomic %) | 11.1 | 16.3 | 18.7 | 19.6 | 25.4 | 28.8 |
|  | Fraction of nitrogen whose nearest neighboring atom is H on surface (atomic %) | 2.1 | 3.2 | 2.8 | 3.1 | 2.4 | 2.1 |
|  | Fraction of calcium on surface (atomic %) | 1.8 | 1.9 | 2.1 | 1.1 | 1.3 | 1.6 |
|  | Fraction of chromium(III) on surface (atomic %) | 1.8 | 2.1 | 3.2 | 2.1 | 1.9 | 1.8 |
| Contact conductivity ($m\Omega \cdot cm^2$) | Before accelerated deterioration test | 3 | 3 | 3 | 3 | 3 | 3 |
|  | After accelerated deterioration test | 7 | 6 | 7 | 8 | 6 | 7 |
|  | (Y: comply, N: not comply) | Y | Y | Y | Y | Y | Y |

TABLE 14

|  | Implement Number | e01 | e02 | e03 | e04 | e05 | e06 | e07 |
|---|---|---|---|---|---|---|---|---|
|  | Abstract | Invention | Invention | Invention | Invention | Invention | Invention | Invention |
| Material | Substrate | M01 | M01 | M01 | M01 | M01 | M01 | M01 |
| Treatment | Pre-treatment | P02 | P03 | P04 | P05 | P06 | P07 | P08 |
|  | Passivation pre-treatment | — | — | — | — | — | — | — |
|  | Current density ($A/m^2$) | — | — | — | — | — | — | — |
|  | Treatment temperature (° C.) | — | — | — | — | — | — | — |
|  | Treatment time (minutes) | — | — | — | — | — | — | — |
|  | Passivation treatment | A09 | A09 | A09 | A09 | A09 | A09 | A09 |
|  | Treatment temperature (° C.) | 100 | 100 | 100 | 100 | 100 | 100 | 100 |
|  | Treatment time (minutes) | 10 | 10 | 10 | 10 | 10 | 10 | 10 |
|  | Stabilization Treatment | B04 | B05 | B06 | B07 | B08 | B09 | B10 |
|  | Treatment temperature (° C.) | 100 | 100 | 100 | 100 | 100 | 100 | 100 |
|  | Treatment time (minutes) | 10 | 10 | 10 | 10 | 10 | 10 | 10 |
|  | Post-treatment | Q01 | Q02 | Q01 | Q02 | Q01 | Q02 | Q02 |
| Substance characteristics | Basic structure of oxide film (Y: comply, N: not comply) | Y | Y | Y | Y | Y | Y | Y |
|  | Main conductive materials | TiN | TiC | TiN | TiCN | TaC | TaN | TaCN |
|  | Fraction of carbon whose nearest neighboring atom is double-bond O on surface (atomic %) | 3.4 | 2.1 | 4.2 | 3.1 | 3.6 | 3.3 | 2.1 |
|  | Fraction of carbon whose nearest neighboring atom is O of a hydroxyl group on surface (atomic %) | 14.2 | 15.2 | 14.1 | 13.3 | 14.2 | 15.1 | 16.2 |
|  | Fraction of carbon whose nearest neighboring atom is H of an alkyl group on surface (atomic %) | 18.1 | 18.1 | 19.3 | 13.1 | 29.3 | 26.5 | 21.1 |
|  | Fraction of nitrogen whose nearest neighboring atom is H on surface (atomic %) | 1.1 | 1.5 | 1.1 | 2.3 | 2.4 | 3.1 | 4.2 |
|  | Fraction of calcium on surface (atomic %) | 1.1 | 1.2 | 3.1 | 2.1 | 1.9 | 1.8 | 1.6 |
|  | Fraction of chromium(III) on surface (atomic %) | 2.6 | 2.5 | 3.1 | 1.2 | 1.3 | 3.1 | 2.5 |
| Contact conductivity ($m\Omega \cdot cm^2$) | Before accelerated deterioration test | 9 | 15 | 11 | 18 | 14 | 19 | 17 |
|  | After accelerated deterioration test | 11 | 16 | 13 | 19 | 19 | 19 | 17 |
|  | (Y: comply, N: not comply) | Y | Y | Y | Y | Y | Y | Y |

The invention claimed is:

1. A titanium or titanium alloy material for a fuel cell separator, the titanium or titanium alloy material comprising:
   an oxide film formed on a titanium or titanium alloy substrate; and
   one or more kinds of conductive materials selected from carbide, nitride, carbonitride, and boride of tantalum, titanium, vanadium, zirconium, and chromium, the conductive materials being dispersed in the oxide film and having a major axis diameter from 1 nm to 100 nm,
   wherein a contact resistance value with a carbon paper is 20 m$\Omega \cdot$cm$^2$ or less at a surface pressure of 10 kgf/cm$^2$ before and after an accelerated deterioration test in which the titanium or titanium alloy material is immersed in a sulfuric acid aqueous solution having an adjusted pH of 4 at 80° C. for four days,
   wherein carbon is present on a superficial layer of the oxide film,
   wherein one of condition (a) or (b) is satisfied: (a) a fraction of carbon atoms whose nearest neighboring atom is a double-bond oxygen atom is 2 atomic % or more, (b) a fraction of carbon atoms whose nearest neighboring atom is an oxygen atom of a hydroxyl group is 10 atomic % or more, and
   wherein condition (c) is satisfied: (c) a fraction of carbon atoms whose nearest neighboring atom is a hydrogen atom of an alkyl group is 40 atomic % or less.

2. The titanium or titanium alloy material for a fuel cell separator according to claim 1,
   wherein 1 atomic % or more nitrogen atoms whose nearest neighboring atom is a hydrogen atom are present on the superficial layer of the oxide film.

3. The titanium or titanium alloy material for a fuel cell separator according to claim 2,
wherein 1 atomic % or more calcium is present on the superficial layer of the oxide film.

4. The titanium or titanium alloy material for a fuel cell separator according to claim 3,
wherein 1 atomic % or more trivalent chromium is present on the superficial layer of the oxide film as oxide or oxyhydroxide.

5. The titanium or titanium alloy material for a fuel cell separator according to claim 2,
wherein 1 atomic % or more trivalent chromium is present on the superficial layer of the oxide film as oxide or oxyhydroxide.

6. The titanium or titanium alloy material for a fuel cell separator according to claim 1,
wherein the oxide film is formed by a passivation treatment, followed by a stabilization treatment.

7. The titanium or titanium alloy material for a fuel cell separator according to claim 6,
wherein the passivation treatment is performed after anode electrolysis is performed on the titanium or titanium alloy substrate in a neutral aqueous solution containing 0.01 mass % or more and 5 mass % or less fluoride ions, or an alkaline aqueous solution having a pH of 12 or more, with a current density from 1 A/m$^2$ to 20 A/m$^2$.

8. The titanium or titanium alloy material for a fuel cell separator according to claim 6,
wherein the stabilization treatment is treatment in which the titanium or titanium alloy material is immersed in an aqueous solution at 60° C. or more to which one or more selected from 1 mass ppm or more rice flour, wheat flour, potato starch, corn flour, soy flour, amine-based compounds, aminocarboxylic-acid-based compounds, phospholipid, a commercially available acidic corrosion inhibitor, polyethylene glycol, and starch are added.

9. A fuel cell separator comprising:
the titanium or titanium alloy material for a fuel cell separator according to claim 1,
wherein carbon or a carbon-containing conductive film is further added to a surface of the titanium or titanium alloy material.

10. A manufacturing method for the titanium or titanium alloy material for a fuel cell separator of claim 1, the manufacturing method comprising:
adding one or more kinds of conductive materials selected from carbide, nitride, carbonitride, and boride of tantalum, titanium, vanadium, zirconium, and chromium to a surface of a titanium or titanium alloy substrate, and then performing passivation treatment in which the substrate is immersed in an aqueous solution obtained by mixing one or more selected from 5 mass % or more nitric acid, 1 mass % or more chromic anhydride, and 5 mass % or more sulfuric acid; and then
performing stabilization treatment in which the substrate is immersed in an aqueous solution at 60° C. or more to which one or more selected from 1 mass ppm or more rice flour, wheat flour, potato starch, corn flour, soy flour, amine-based compounds, aminocarboxylic-acid-based compounds, phospholipid, a commercially available acidic corrosion inhibitor, polyethylene glycol, and starch are added,
wherein the aqueous solution deactivates active oxygen.

11. The manufacturing method for a titanium or titanium alloy material for a fuel cell separator according to claim 10,
wherein, prior to the passivation treatment, passivation pre-treatment is performed in which anode electrolysis is performed on the titanium or titanium alloy substrate, to which the conductive materials have been added, in a neutral aqueous solution containing 0.01 mass % or more and 5 mass % or less fluoride ions, or an alkaline aqueous solution having a pH of 12 or more, with a current density from 1 A/m$^2$ to 20 A/m$^2$.

12. The manufacturing method for a titanium or titanium alloy material for a fuel cell separator according to claim 10, the manufacturing method further comprising:
performing treatment in which carbon or a carbon-containing conductive film is further added to a surface of the titanium or titanium alloy material on which the stabilization treatment has been performed.

13. The manufacturing method for a titanium or titanium alloy material for a fuel cell separator according to claim 11, the manufacturing method further comprising:
performing treatment in which carbon or a carbon-containing conductive film is further added to a surface of the titanium or titanium alloy material on which the stabilization treatment has been performed.

14. The titanium or titanium alloy material for a fuel cell separator according to claim 6,
wherein the passivation treatment is treatment in which the titanium or titanium alloy substrate is immersed in an aqueous solution at 50° C. or more, obtained by mixing one or more selected from 5 mass % or more nitric acid, 1 mass % or more chromic anhydride, and 5 mass % or more sulfuric acid.

15. The titanium or titanium alloy material for a fuel cell separator according to claim 1,
wherein the stabilization treatment is a treatment to deactivate active oxygen.

* * * * *